United States Patent
Shimada et al.

(10) Patent No.: US 8,669,698 B2
(45) Date of Patent: Mar. 11, 2014

(54) WAVELENGTH CONVERTER AND SEMICONDUCTOR LIGHT EMITTING DEVICE

(75) Inventors: Miyoko Shimada, Kanagawa-ken (JP);
Akhiro Kojima, Kanagawa-ken (JP);
Yosuke Akimoto, Kanagawa-ken (JP);
Hideyuki Tomizawa, Gunma-ken (JP);
Hideto Furuyama, Kanagawa-ken (JP);
Yoshiaki Sugizaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/598,454

(22) Filed: Aug. 29, 2012

(65) Prior Publication Data

US 2013/0285536 A1    Oct. 31, 2013

(30) Foreign Application Priority Data

Apr. 27, 2012   (JP) .................................. 2012-103869

(51) Int. Cl.
*H01L 33/00*   (2010.01)
*H01J 1/62*    (2006.01)

(52) U.S. Cl.
USPC .............................. 313/501; 313/502; 257/98

(58) Field of Classification Search
USPC .......... 313/501–502, 483; 257/98, 99; 362/84
See application file for complete search history.

(56) References Cited

U.S. PATENT DOCUMENTS

| | | | |
|---|---|---|---|
| 8,110,421 B2 | 2/2012 | Sugizaki et al. | |
| 2010/0117511 A1* | 5/2010 | Kawakami et al. | 313/483 |
| 2010/0148198 A1 | 6/2010 | Sugizaki et al. | |
| 2011/0147778 A1* | 6/2011 | Ichikawa | 257/98 |
| 2012/0019123 A1 | 1/2012 | Furukawa | |

FOREIGN PATENT DOCUMENTS

| | | |
|---|---|---|
| JP | 2007227791 A | 9/2007 |
| JP | 2010199400 A | 9/2010 |
| JP | 2010278474 A | 12/2010 |
| JP | 2011126994 A | 6/2011 |
| JP | 2012004298 A | 1/2012 |

* cited by examiner

*Primary Examiner* — Karabi Guharay
(74) *Attorney, Agent, or Firm* — Patterson & Sheridan, LLP

(57) ABSTRACT

According to an embodiment, a wavelength converter includes a resin allowing light emitted from a light source to pass through, a plurality of particle-shaped fluorescent substances dispersed in the resin, and fillers dispersed in the resin with a particle diameter smaller than the fluorescent substance. The fluorescent substances absorb the light emitted from the light source and emits fluorescence having a wavelength different from a wavelength of the light emitted from the light source; and a distribution of the fillers has higher density near the fluorescent substance than a density at a middle position between the fluorescent substances adjacent to each other.

16 Claims, 18 Drawing Sheets

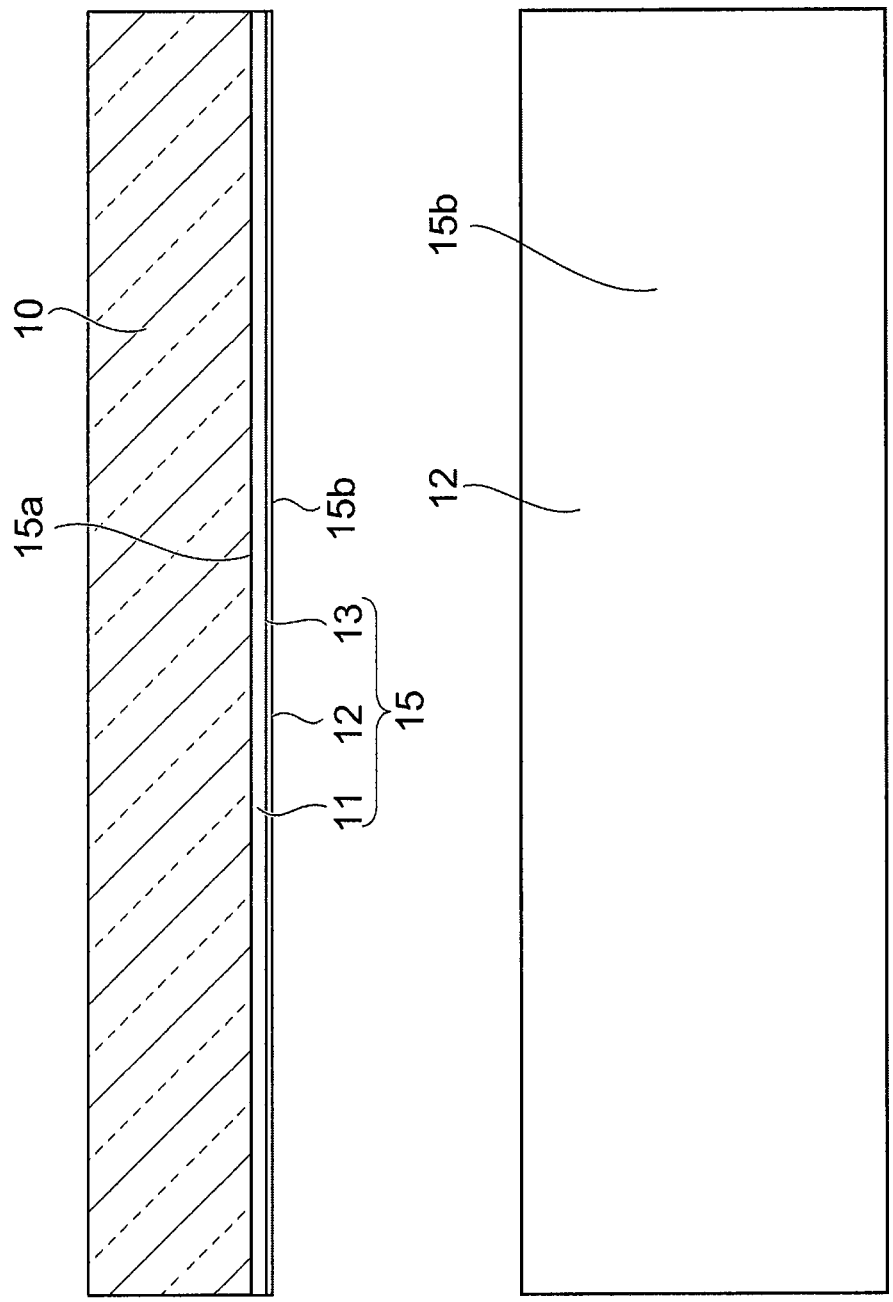

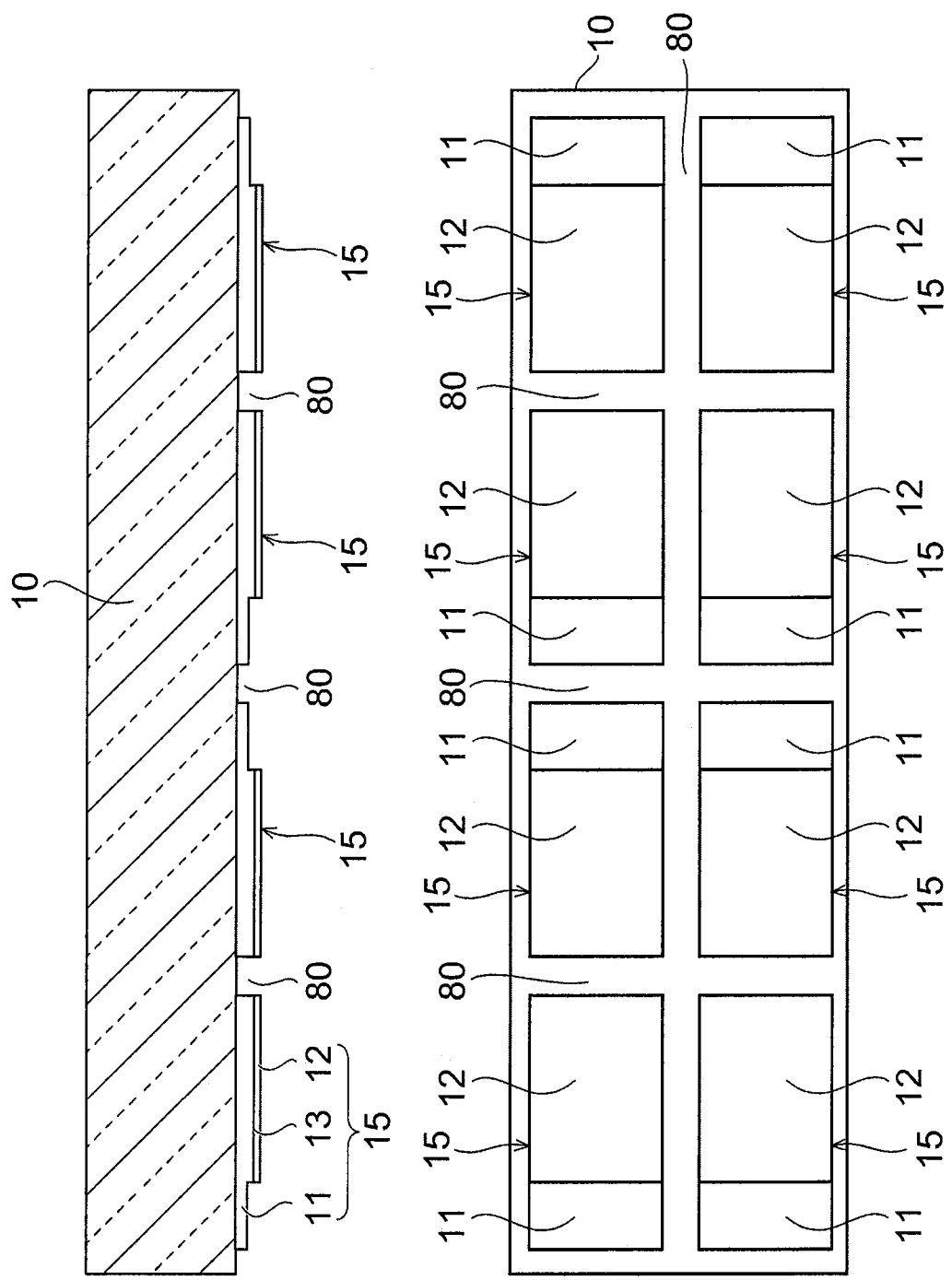

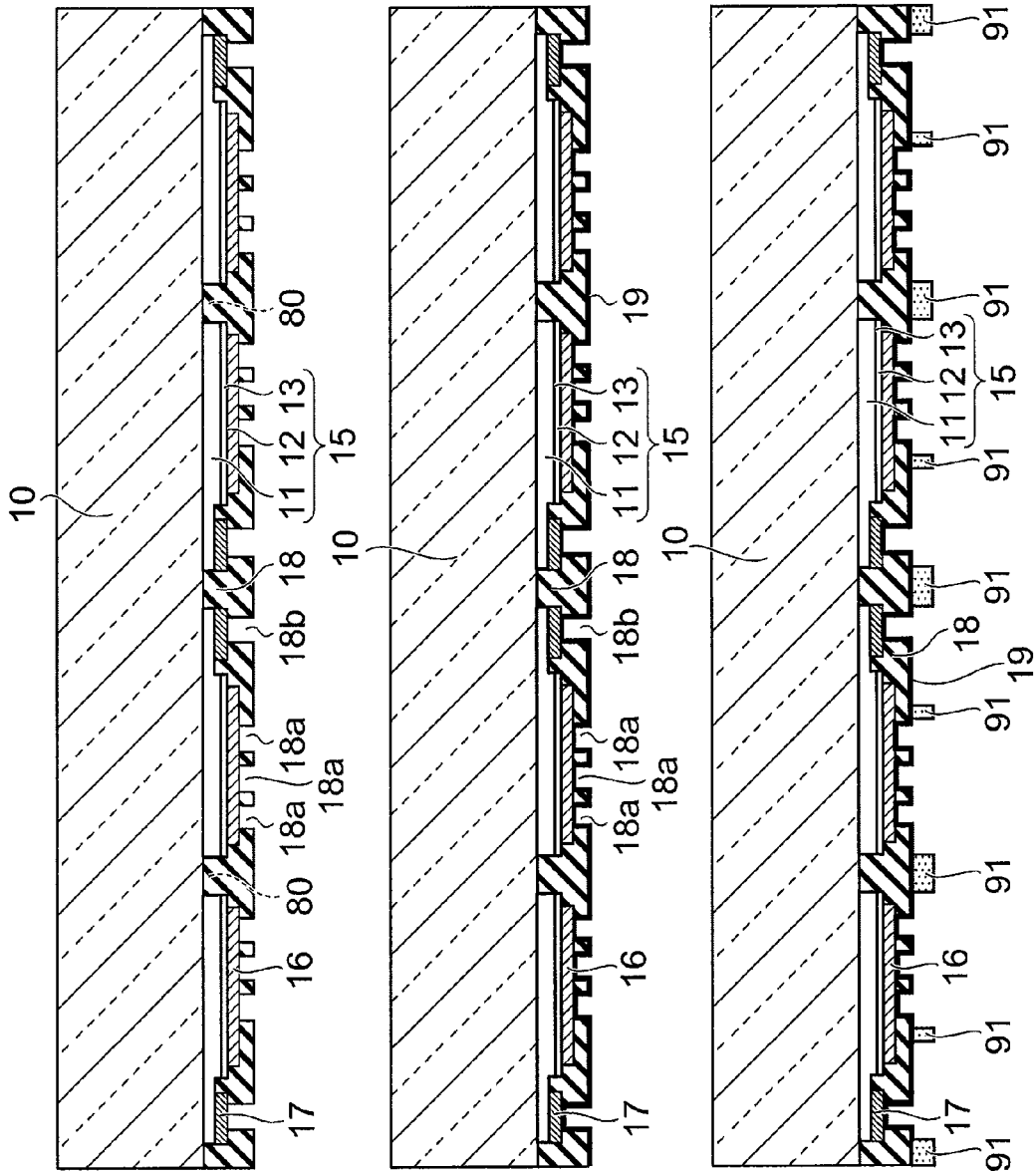

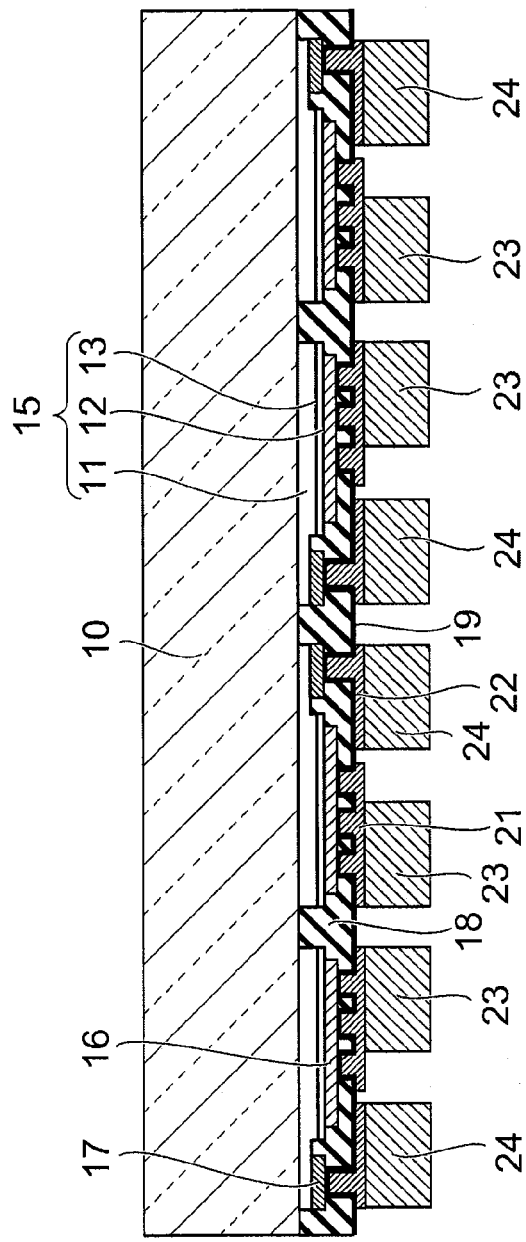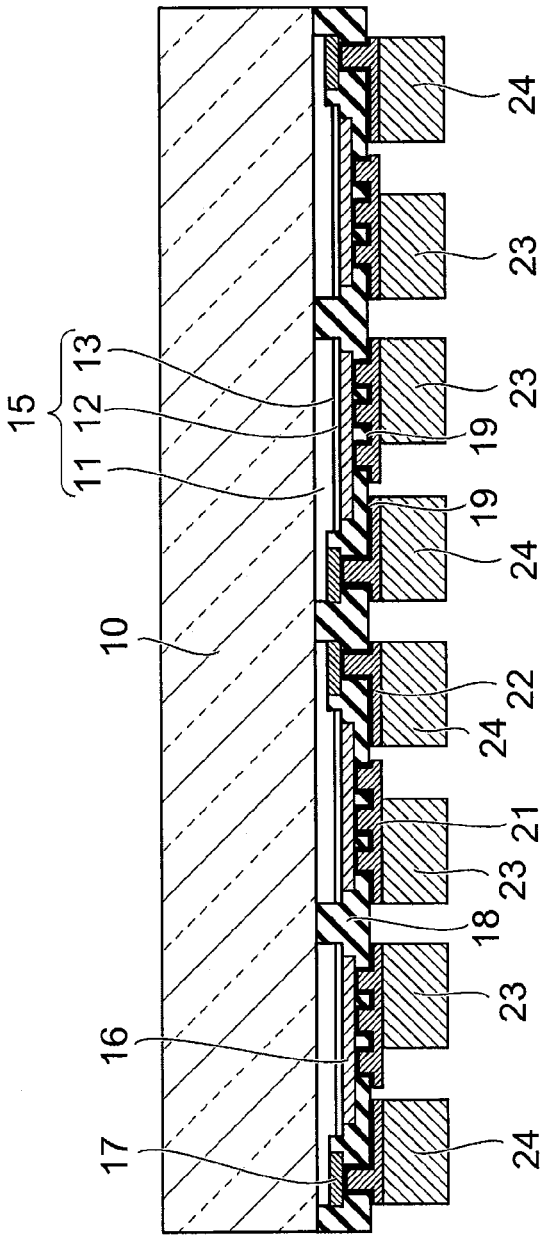
FIG. 12A
FIG. 12B

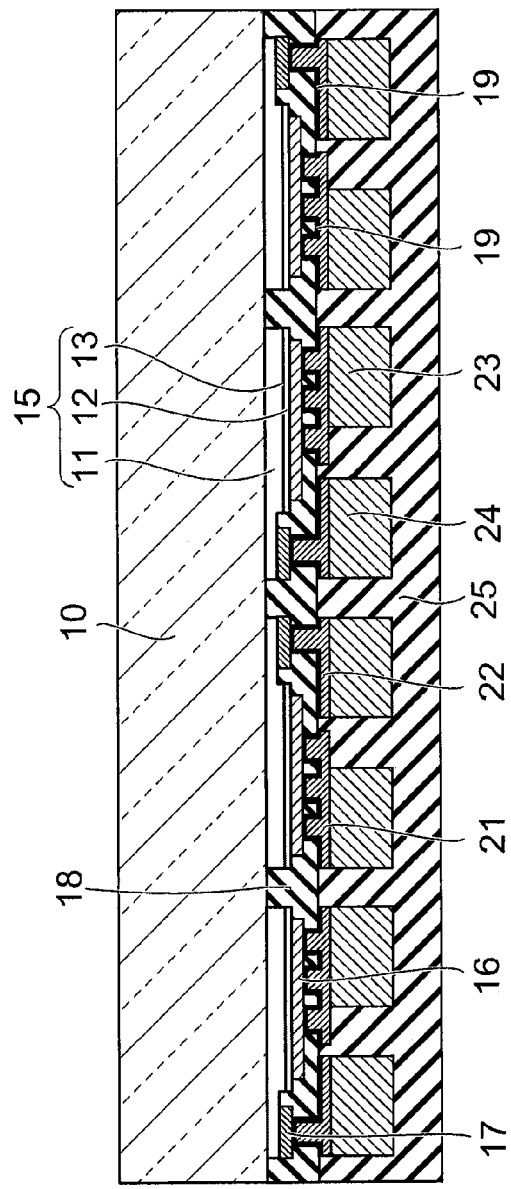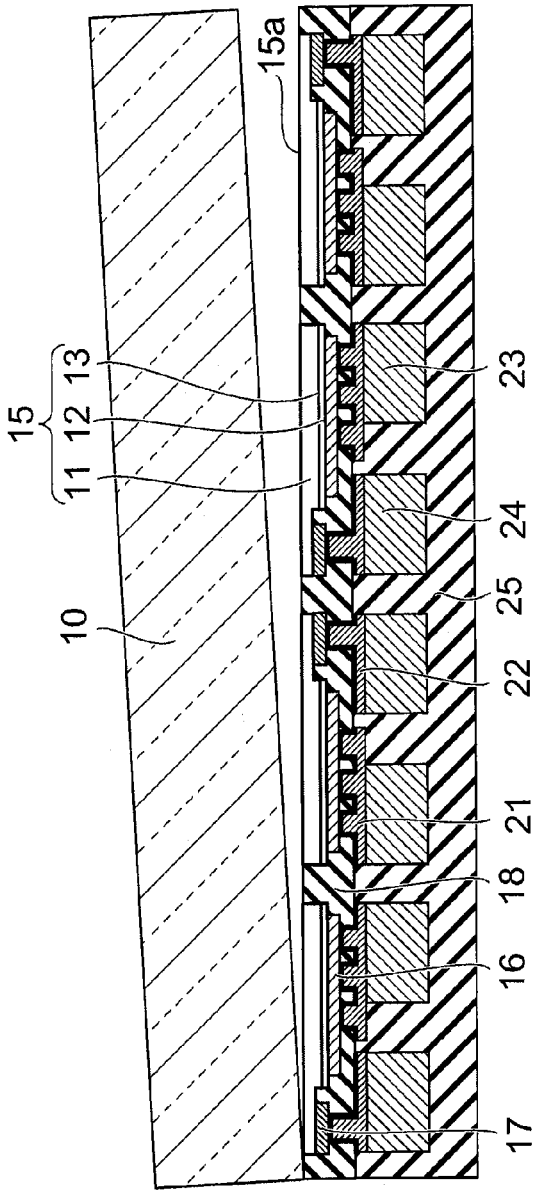
FIG. 13A
FIG. 13B

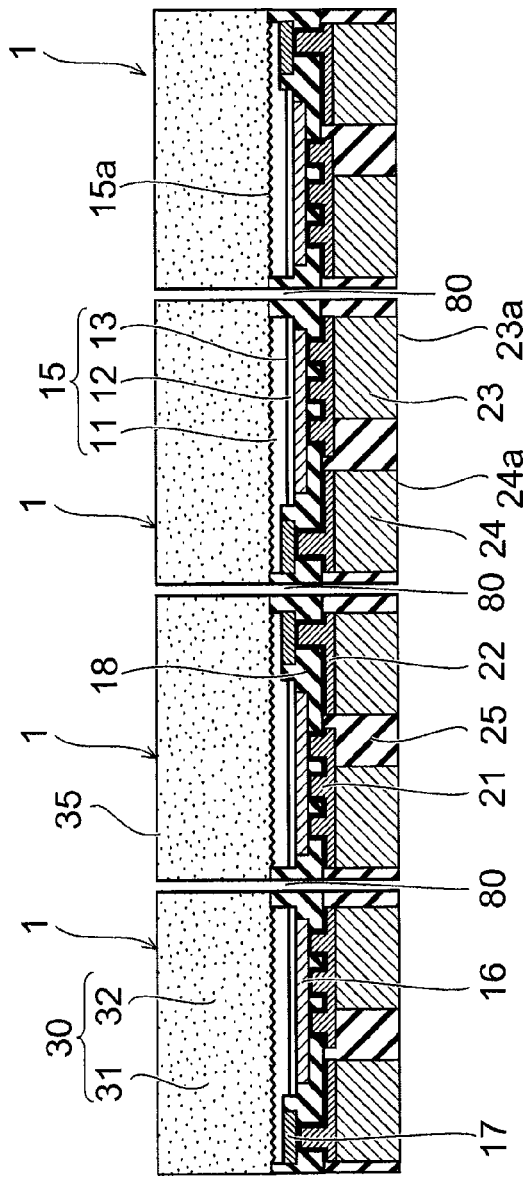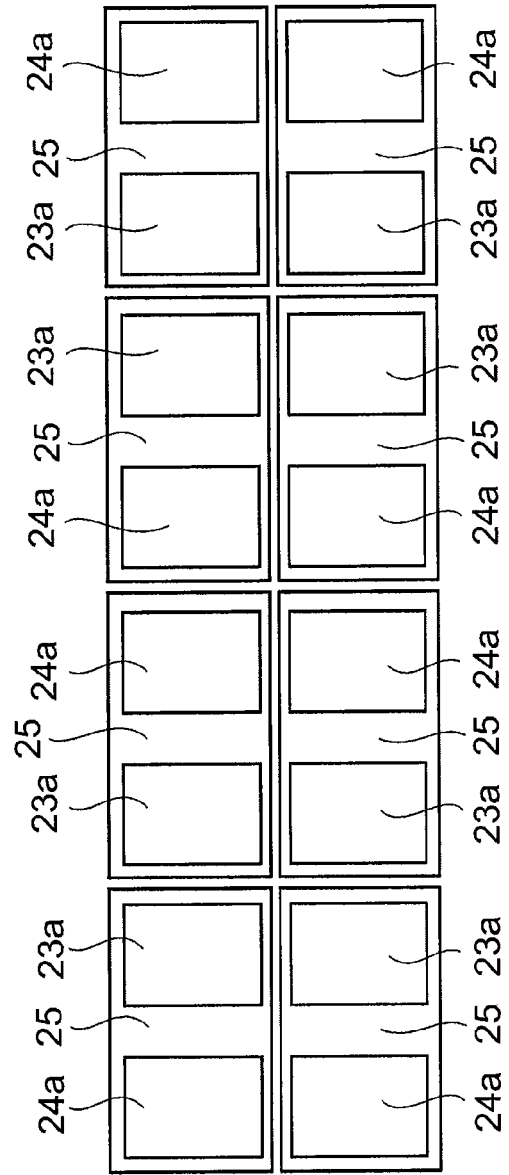
FIG. 15A
FIG. 15B

WAVELENGTH CONVERTER AND SEMICONDUCTOR LIGHT EMITTING DEVICE

CROSS-REFERENCE TO RELATED APPLICATIONS

This application is based upon and claims the benefit of priority from Japanese Patent Application No. 2012-103869, filed on Apr. 27, 2012; the entire contents of which are incorporated herein by reference.

FIELD

Embodiments are generally related to a wavelength converter and a semiconductor light emitting device.

BACKGROUND

Semiconductor light emitting devices that emit visible light such as white light or light of the other wavelength band will be widely used as small-sized and easily handled light sources. Such a device includes a semiconductor light emitting element and fluorescent substances, and emits light combining the radiations of the semiconductor light emitting element and the fluorescent substances. Thus, there may be a demand for improving the optical characteristics of the semiconductor light emitting devices such as the optical output, light distribution and color uniformity.

BRIEF DESCRIPTION OF THE DRAWINGS

FIGS. 4A to 15B are schematic views illustrating manufacturing process of the semiconductor light emitting device according to the first embodiment;

DETAILED DESCRIPTION

Figure 1:
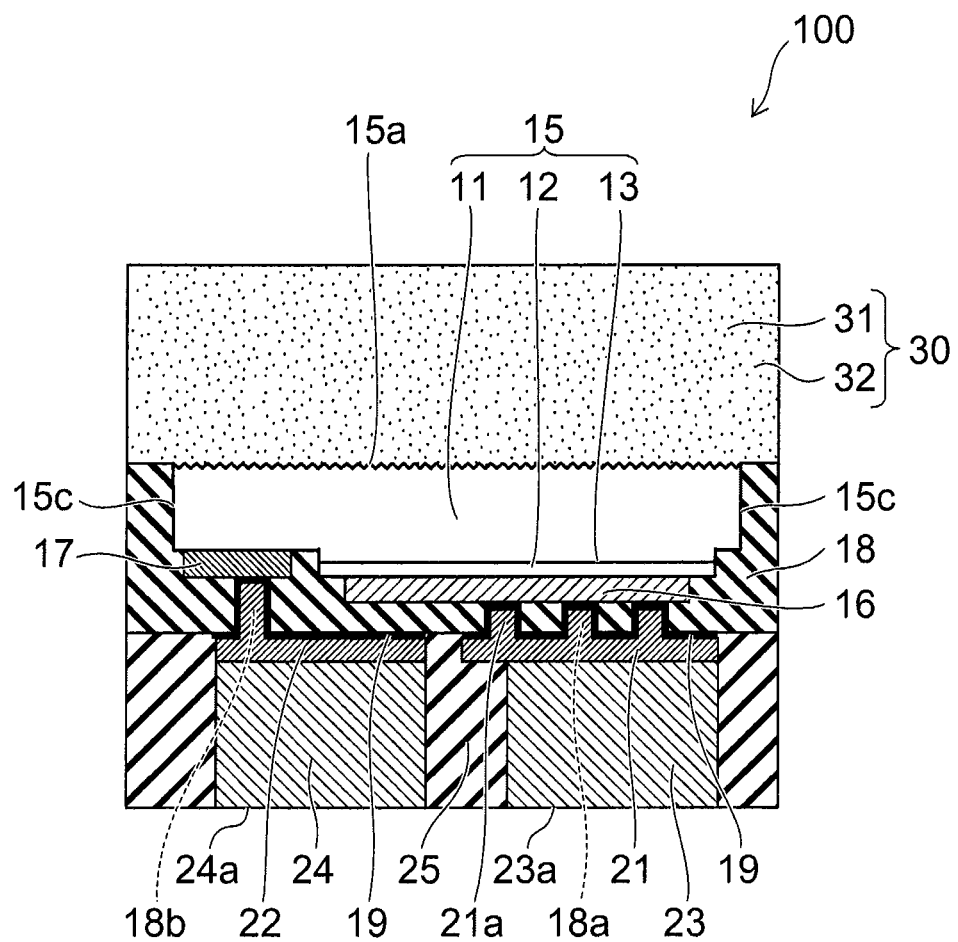
FIG. 1 is a schematic cross-sectional view of a semiconductor light emitting device according to a first embodiment.

According to an embodiment, a wavelength converter includes a resin allowing light emitted from a light source to pass through, a plurality of particle-shaped fluorescent substances dispersed in the resin, and fillers dispersed in the resin with a particle diameter smaller than the fluorescent substance. The fluorescent substances absorb the light emitted from the light source and emits fluorescence having a wavelength different from a wavelength of the light emitted from the light source; and a distribution of the fillers has higher density near the fluorescent substance than a density at a middle position between the fluorescent substances adjacent to each other.

Embodiments will be described with reference to the drawings. Like reference numerals in the drawings denote like elements, and the descriptions of the like elements are appropriately omitted and the different elements are described.

First Embodiment

FIG. 1 is a schematic cross-sectional view of a semiconductor light emitting device 100 according to a first embodiment. The semiconductor light emitting device 100 includes a light emitting layer 13 that serves as a light source and a fluorescent substance layer 30. The fluorescent substance layer 30 is a wavelength converter and converts the wavelength of the light radiated from the light source (light emitting layer 13). In other words, the fluorescent substance layer 30 includes a resin 31 (hereinafter, referred to as a transparent resin 31) that allows the light radiated from the light emitting layer 13 to pass through it, a plurality of particle-shaped fluorescent substances 32 that absorb the light emitted from the light emitting layer 13 and emits fluorescence having a wavelength different from the wavelength of the radiation light, and fillers 35. The density of the fillers 35 according to the embodiment has a distribution in which the density at the middle position between the fluorescent substances adjacent to each other is lower than the density near the fluorescent substances.

Hereinafter, the configuration of the light emitting device 100 will be described in detail with reference to FIG. 1.

The semiconductor light emitting device 100 includes a semiconductor layer 15 that includes a light emitting layer 13. In addition, the semiconductor layer 15 has a first face 15a and a second face that is located on a side opposite to the first face 15a. On a second face side, electrodes and an interconnection part are provided, and light is emitted mainly to the outer side from the first face 15a on which the electrodes and the interconnection part are not provided.

The semiconductor layer 15 includes a first semiconductor layer 11 and a second semiconductor layer 12. The first semiconductor layer 11 and the second semiconductor layer 12, for example, contain gallium nitride. The first semiconductor layer 11 may include an underlying buffer layer, an n-type GaN layer, and the like. The second semiconductor layer 12 includes a p-type GaN layer, a light emitting layer (active layer) 13, and the like. The light emitting layer 13 may include a material that emits blue light, purple light, blue-purple light, ultraviolet light, or the like.

The second face of the semiconductor layer 15 is formed in a concavo-convex shape, and a convex part includes the light emitting layer 13. A p-side electrode 16 is provided on the surface of the second semiconductor layer 12, which is the surface of the convex part. In other words, the p-side electrode 16 is provided on a first region of the second face that is the top surface of the convex part of the semiconductor layer 15.

In the semiconductor layer 15, a part that does not include the light emitting layer 13 is provided on a side of the convex part, where the light emitting layer 13 is removed and a surface of the first semiconductor layer 11 is exposed. An n-side electrode 17 is provided on the exposed surface of the first semiconductor layer 11. In other words, the n-side electrode 17 is provided in a second region of the second surface that is the surface of the part not including the light emitting layer 13.

As shown in FIG. 6B, the first region is larger than the second region in the second face of the semiconductor layer 15. That is, the area of the second semiconductor layer 12 that includes the light emitting layer 13 is larger than the exposed area of the first semiconductor layer 11 that does not include the light emitting layer 13.

Figures 7A, 7B:
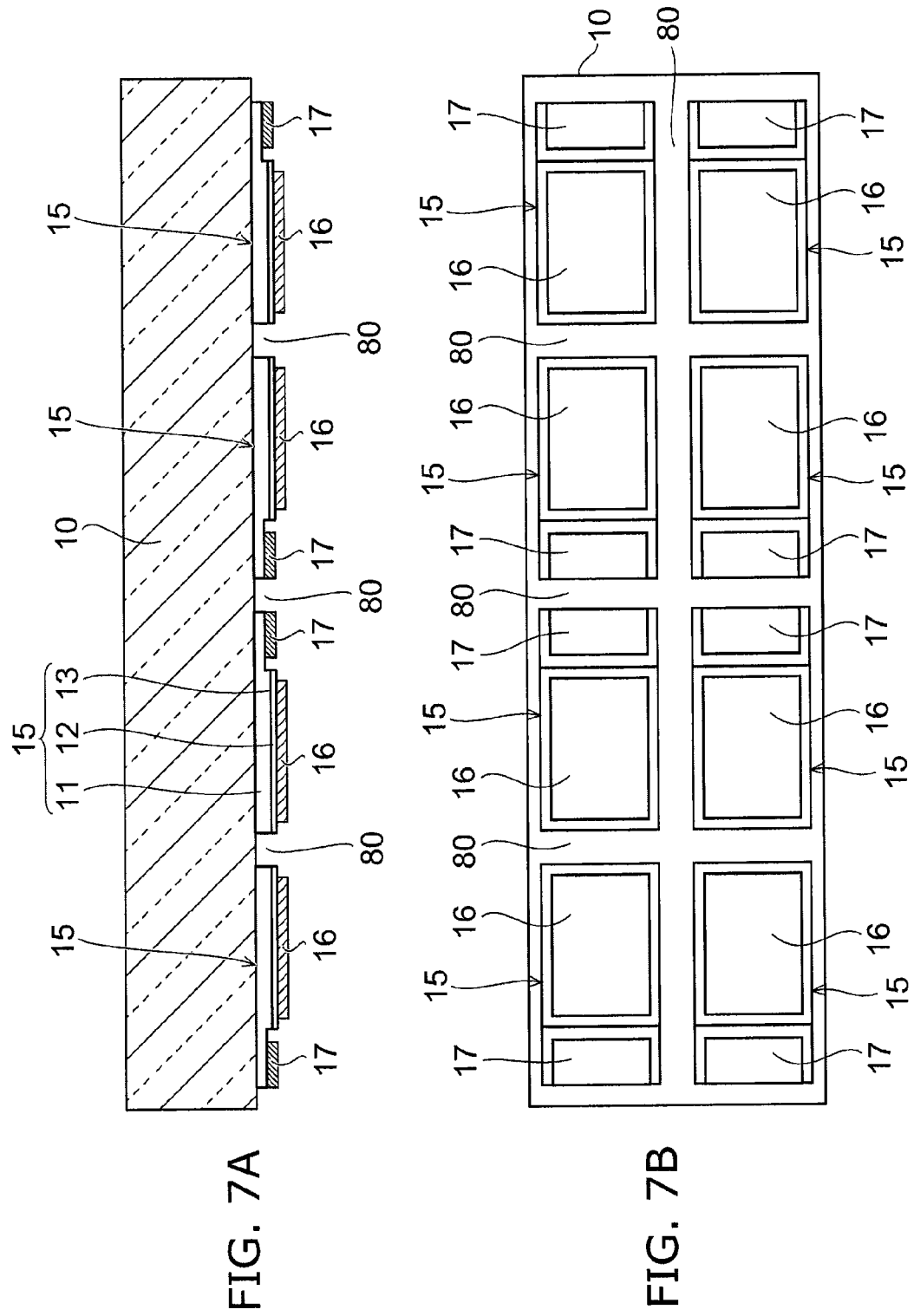

In addition, as shown in FIG. 7B, on the semiconductor layer 15, the area of the p-side electrode 16 that is provided on the first region that includes the light emitting layer 13 is larger than the area of the n-side electrode 17 that is provided on the second region that does not include the light emitting layer 13. Accordingly, a relatively wide light emitting area is obtained. Here, the layout of the p-side electrodes 16 and the n-side electrodes 17, which is shown in FIG. 7B, is an example, and the embodiment is not limited thereto.

A first insulating film (hereinafter, simply referred to as an insulating film 18) is provided on the second face side of the semiconductor layer 15. The insulating film 18 covers the semiconductor layer 15, the p-side electrode 16, and the n-side electrode 17. In addition, the insulating film 18 covers the side surfaces of the light emitting layer 13 and the second semiconductor layer 12 for the protection thereof.

In addition, another insulating film (for example, a silicon oxide film) may be provided between the insulating film 18 and the semiconductor layer 15. The insulating film 18, for example, is formed of a resin such as polyimide that is superior for the patterning of fine openings. Alternatively, an inorganic film such as a silicon oxide film or a silicon nitride film may be used as the material of the insulating film 18.

The insulating film 18 is not provided on the first face 15a. The insulating film 18 covers a side surface 15c for the protection, which extends from the first face 15a to the second face in the semiconductor layer 15.

A p-side interconnection layer 21 and an n-side interconnection layer 22 are provided on a face of the insulating film 18 opposite to the second face of the semiconductor layer 15, so as to be separated from each other.

Parts of the p-side interconnection layer 21 are provided in a plurality of first openings 18a that are formed in the insulating film 18 up to the p-side electrodes 16, and the p-side interconnection layer 21 is electrically connected to the p-side electrodes 16. A part of the n-side interconnection layer 22 is also provided in a second opening 18b that is formed in the insulating film 18 up to the n-side electrodes 17, and the n-side interconnection layer 22 is electrically connected to the n-side electrodes 17.

A p-side metal pillar 23 is provided on a face of the p-side interconnection layer 21 opposite to the p-side electrode 16. Then, a p-side interconnection according to the embodiment includes the p-side interconnection layer 21, the p-side metal pillar 23, and a metal film 19 that serves as a seed layer to be described later.

An n-side metal pillar 24 is provided on a face of the n-side interconnection layer 22 opposite to the n-side electrodes 17. Then, an n-side interconnection according to the embodiment includes the n-side interconnection layer 22, the n-side metal pillar 24, and the metal film 19 that is used as the seed layer.

A resin layer 25 serving as a second insulating film is stacked on the insulating film 18. The resin layer 25 covers the periphery of the p-side interconnection and the periphery of the n-side interconnection. In addition, the resin layer 25 is filled up between the p-side metal pillar 23 and the n-side metal pillar 24.

The side surfaces of the p-side metal pillar 23 and the n-side metal pillar 24 are covered with the resin layer 25. A face of the p-side metal pillar 23 opposite to the p-side interconnection layer 21 is exposed from the resin layer 25 and serves as a p-side external terminal 23a. A face of the n-side metal pillar 24 opposite to the n-side interconnection layer 22 is exposed from the resin layer 25 and serves as an n-side external terminal 24a.

The p-side external terminal 23a and the n-side external terminal 24a are bonded to a pad formed in a mounting substrate through a bonding member such as a solder, other metal, a material having conductivity, or the like.

The p-side external terminal 23a and the n-side external terminal 24a are exposed on the same face (the lower face in FIG. 1) of the resin layer 25, having a longer distance therebetween than a distance between the p-side interconnection layer 21 and the n-side interconnection layer 22 on the insulating film 18. The p-side external terminal 23a and the n-side external terminal 24a are separated from each other with such a distance, so that the external terminals do not form a short circuit via solder or the like at the time of being mounted on the mounting substrate.

On the other hand, the p-side interconnection layer 21 may approach the n-side interconnection layer 22 up to a process limit, and accordingly, the area of the p-side interconnection layer 21 may be widened. Thereby, the contact area can be enlarged between the p-side interconnection layer 21 and the p-side electrode 16.

Furthermore, the area of the p-side interconnection layer 21 that is in contact with the p-side electrodes 16 through the plurality of first openings 18a is possible to be larger than the area of the n-side interconnection layer 22 that is in contact with the n-side electrodes 17 through the second openings 18b.

As a result, the current distribution toward the light emitting layer 13 is improved, and the heat dissipation of the light emitting layer 13 can be improved.

In the n-side interconnection layer 22, the portion extending on the insulating film 18 can be formed to have larger area than the contact portion that is in contact with the n-side electrodes 17.

According to the embodiment, a high optical output can be acquired, since the light emitting layer 13 is formed over the first region that is larger than the second region on which the n-side electrode 17 is provided. In addition, the n-side interconnection layer 22 having a larger area than the n-side electrode 17 can be provided on the mounting face side.

The first semiconductor layer 11 is electrically connected to the n-side metal pillar 24 having the n-side external terminal 24a through the n-side electrode 17, the metal film 19, and the n-side interconnection layer 22. The second semiconductor layer 12 including the light emitting layer 13 is electrically connected to the p-side metal pillar 23 having the p-side external terminal 23a through the p-side electrode 16, the metal film 19, and the p-side interconnection layer 21.

The p-side metal pillar 23 is thicker than the p-side interconnection layer 21, and the n-side metal pillar 24 is thicker than the n-side interconnection layer 22. Each thickness of the p-side metal pillar 23, the n-side metal pillar 24, and the resin layer 25 is larger than that of the semiconductor layer 15. Here, the "thickness" represents a thickness in the vertical direction in FIG. 1.

In addition, each thickness of the p-side metal pillar 23 and the n-side metal pillar 24 is larger than that of a stacked body that includes the semiconductor layer 15, the p-side electrode 16, the n-side electrode 17, and the insulating film 18. In addition, the aspect ratio (the ratio of the thickness to the planar size) of each one of the metal pillars 23 and 24 is not limited to be one or more, and the ratio may be less than one. In other words, each thickness of the metal pillars 23 and 24 may be smaller than the planar size of the metal pillars 23 and 24.

According to the embodiment, even though a substrate 10 used for forming the semiconductor layer 15 is removed as described later, the mechanical strength of the semiconductor light emitting device 100 can be maintained, since the semiconductor layer 15 is stably supported by the p-side metal pillar 23, the n-side metal pillar 24, and the resin layer 25.

Copper, gold, nickel, silver, and the like can be used as the materials of the p-side interconnection layer 21, the n-side interconnection layer 22, the p-side metal pillar 23, and the n-side metal pillar 24. Among these materials, copper is superior to the other material in thermal conductivity, resistance for migration, and adhesiveness to an insulating material.

The resin layer 25 reinforces the p-side metal pillar 23 and the n-side metal pillar 24. It is preferable that the thermal expansion coefficient of the resin layer 25 is the same as or close to the thermal expansion coefficient of the mounting substrate. As examples of such a resin layer 25, there are an epoxy resin, a silicone resin, a fluorine resin, and the like.

In addition, when the semiconductor light emitting device 100 is mounted on the mounting substrate through the p-side external terminal 23a and the n-side external terminal 24a, the stress applied to the semiconductor layer 15 through soldering or the like can be absorbed and relieved by the p-side metal pillar 23 and the n-side metal pillar 24.

The p-side interconnection that includes the p-side interconnection layer 21 and the p-side metal pillar 23 is connected to the p-side electrode 16 through a plurality of vias 21a that are provided inside the plurality of first openings 18a and are separated from each other. Accordingly, an effective stress relieving can be obtained through the p-side interconnection.

Figure 16:
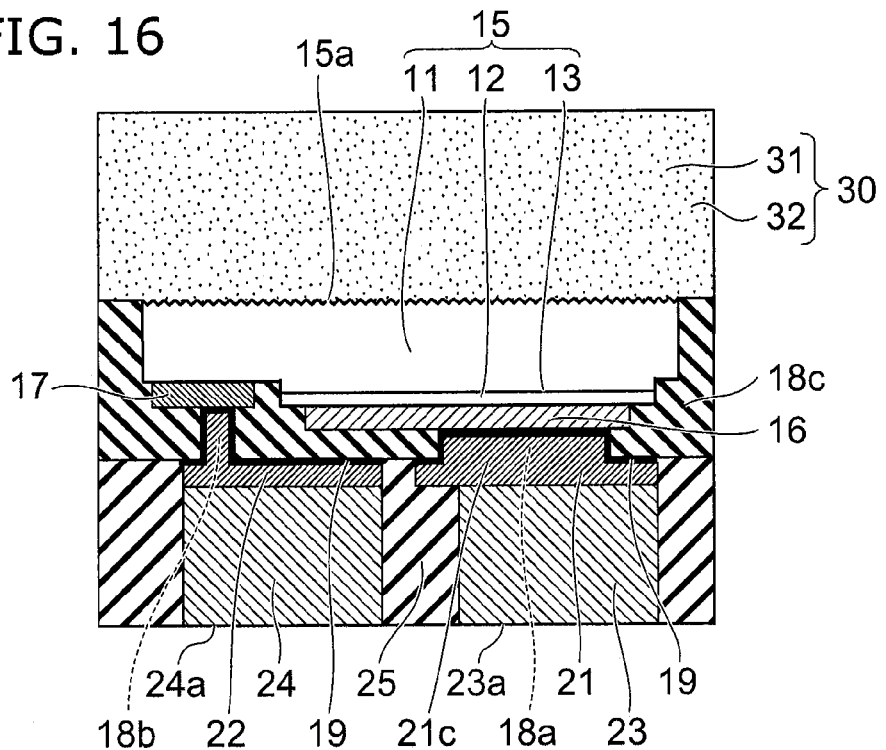
FIG. 16 is a schematic cross-sectional view of a semiconductor light emitting device according to a variation of the first embodiment.

Alternatively, as shown in FIG. 16, the p-side interconnection layer 21 may be connected to the p-side electrode 16 through a post 21c that is provided inside one large first opening 18a and has a planar size larger than the via 21a. In such a case, the heat dissipation of the light emitting layer 13 can be improved through the p-side electrode 16, the p-side interconnection layer 21, and the p-side metal pillar 23, all of which are formed of metal.

As described later, the substrate 10 used for a crystal growth of the semiconductor layer 15 is removed from the first face 15a. Accordingly, the height of the semiconductor light emitting device 100 can be lowered.

A fine concavo-convex is formed on the first face 15a of the semiconductor layer 15 using wet etching (frost process), where an alkali-based solution is applied to the first face 15a. The light emitted from the light emitting layer 13 can be extracted outside through the first face 15a, suppressing light reflection at various incident angles by providing the concavo-convex on the first face 15a.

A fluorescent substance layer 30 is provided on the first face 15a. The fluorescent substance layer 30 includes a transparent resin 31 and a plurality of fluorescent substances 32, which have a particle or powder form, dispersed in the transparent resin 31. The fluorescent substance layer 30 also includes fillers dispersed therein The transparent resin 31 has transparency for the lights emitted from the light emitting layer 13 and the fluorescent substance 32. For example, a silicone resin, an acrylic resin, a phenyl resin, or the like may be used as the transparent resin 31.

The fluorescent substance 32 absorbs the light emitted from the light emitting layer 13 as excited light and emits wavelength-converted light. Accordingly, the semiconductor light emitting device 100 can emit mixed lights emitted from the light emitting layer 13 and the fluorescent substance 32.

In a case where the fluorescent substance 32 is a yellow fluorescent substance that emits yellow light, a white color, a light bulb color, or the like can be obtained as a mixed color of blue light emitted from the light emitting layer 13, which contains a GaN-based material, and the yellow light emitted from the fluorescent substance 32. In addition, the fluorescent substance layer 30 may be configured to contain a plurality of types of fluorescent substances (for example, a red fluorescent substance that emits red light and a green fluorescent substance that emits green light).

The fillers are dispersed so as to adjust the viscosity of the liquid-phase transparent resin 31 before being molded on the first face 15a. For example, a particle-shaped silica can be used as the filler.

Figure 2A:
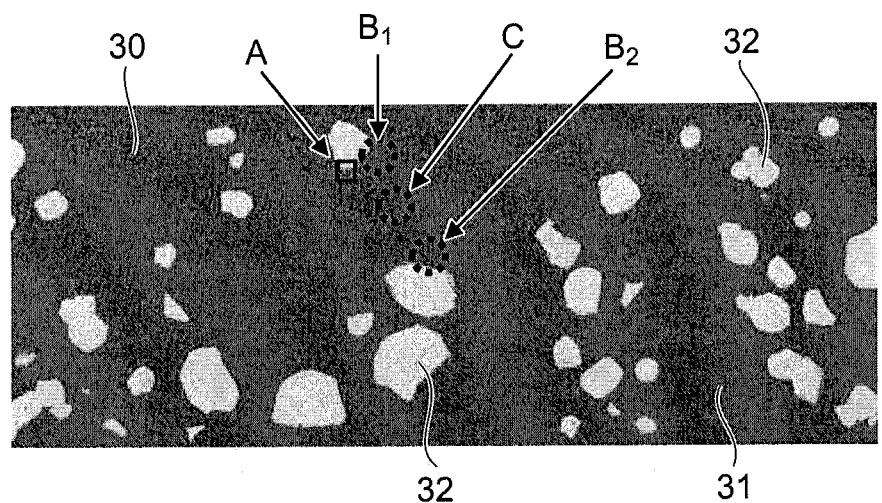
FIGS. 2A and 2B are images of a fluorescent substance layer according to the first embodiment.
Figure 2B:
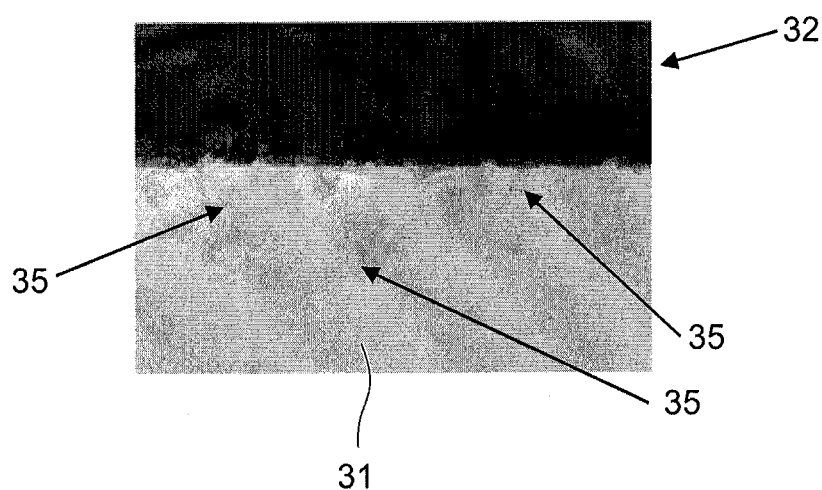

FIGS. 2A and 2B are images that show the cross-sections of the fluorescent substance layer 30 according to the first embodiment. FIG. 2A is a scanning electron microscope (SEM) image that shows a partial cross-section of the fluorescent substance layer 30, and FIG. 2B is a transmission electron microscope (TEM) image in which an area A shown in FIG. 2A is enlarged.

As shown in FIG. 2A, the fluorescent substance layer 30 includes a transparent resin 31 and a plurality of fluorescent substances 32 dispersed in the transparent resin 31. The particle diameter of the fluorescent substance 32, for example, is in the range of several micrometers (μm) to 20 μm.

FIG. 2B is the TEM image acquired by enlarging an area A that is located near the interface between the fluorescent substances 32 and the transparent resin 31. In FIG. 2B, the fillers 35 that are dispersed in the transparent resin 31 have light contrast so as to be visually recognized. The filler 35 is silica having a particle diameter of several tens of nanometers (nm), and it is found that the fillers 35 are unevenly distributed near the fluorescent substances 32. In addition, since the fillers 35 allow the excitation light emitted from the light emitting layer 13 to pass through it, the fillers 35 do not disturb the absorption of the excitation light in the fluorescent substances 32 even when the fillers 35 are unevenly distributed nearby.

For example, the density of fillers 35 in areas $B_1$ and $B_2$ close to the fluorescent substance 32 shown in FIG. 2A is higher than the density of the fillers 35 in a middle area C between fluorescent substances 32 that are adjacent to each other. Accordingly, fluorescence emitted from the fluorescent substance 32 is scattered, and thereby, the distribution of light emitted from the semiconductor light emitting device may be changed. At this time, the absorption of light does not occur, and accordingly, there is no decrease in the light output.

Figure 3A:
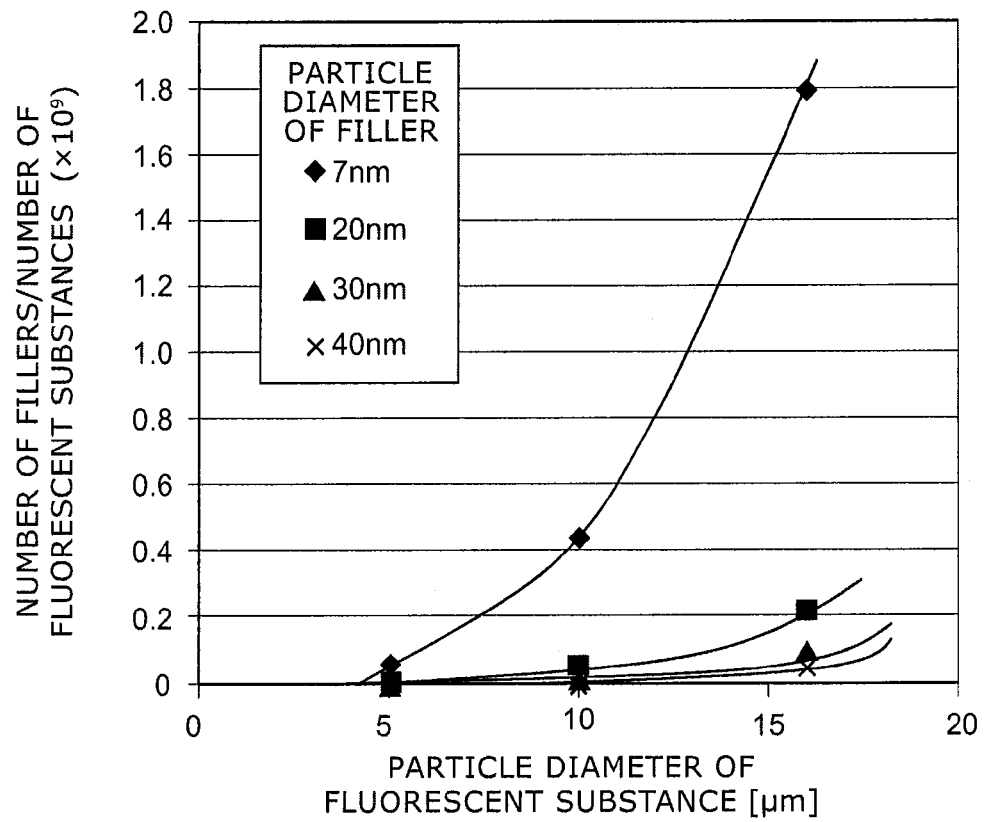
FIG. 3A is a graph showing a characteristic of the fluorescent substance layer according to the first embodiment.

FIG. 3A is a graph showing the characteristics of the fluorescent substance layer 30 according to the first embodiment. The vertical axis represents a ratio of the number of fillers 35 to the number of fluorescent substances 32. The horizontal axis represents the particle diameter of the fluorescent substance 32.

Figure 3B:
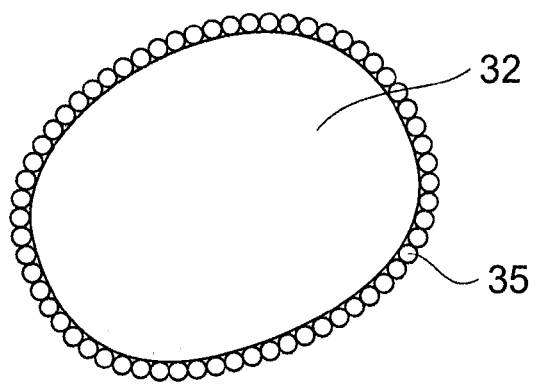
FIG. 3B is a schematic cross-sectional view of the fluorescent substance.

For example, by unevenly distributing the fillers 35 on the periphery of the fluorescent substances 32 so as to cover the fluorescent substances 32, the luminous efficiency can be improved. FIG. 3A, for example, shows the relation between the number of fillers 35 that can be attached to the fluorescent substances 32 so as to cover the whole surface as shown in FIG. 3B, and the particle diameter of the fluorescent substances 32. In addition, the ratio of the size of the fluorescent substance 32 to the size of the filler 35, which is shown in FIG. 3B, is different from the actual ratio.

In other words, the vertical axis is the number $N_S$ of fillers 35 that can be attached to the surface of one fluorescent substance 32 so as to cover the whole surface. A graph $R_1$ shown in FIG. 3A shows the dependency of the number $N_S$ of fillers 35 on the particle diameter of the fluorescent substance 32 in a case where the particle diameter of the filler 35 is set to 7 nm. In addition, graphs $R_2$, $R_3$, and $R_4$ show cases in which the particle diameters of filler 35 are set to 20 nm, 30 nm, and 40 nm, respectively. As shown in FIG. 3A, the number $N_S$ of fillers 35 to cover the surface increases as the particle diameter of the fluorescent substance 32 increases. In addition, the number $N_S$ of fillers decreases as the particle diameter of the filler 35 increases.

The amount of fillers 35 that are dispersed in the transparent resin 31 is preferably more than the number $N_S$ of fillers 35 that cover the whole surface of the fluorescent substance 32 and, for example, is preferably $2 \times 10^6$ to $2 \times 10^9$ times the number $N_S$ of fillers. When the distributed amount of fillers 35 is larger than $2 \times 10^9$ times the number $N_S$ of fillers, the fillers 35 are not unevenly distributed near the fluorescent substances 32 and are evenly distributed over the transparent resin 31. On the other hand, when the distributed amount of fillers 35 is smaller than $2 \times 10^6$ times the number $N_S$ of fillers 35, the viscosity of the transparent resin 31 of the liquid phase becomes too high, so that the fluorescent substances 32 are not evenly distributed therein.

For example, in a case where the distributed amount of fillers 35 is $1 \times 10^7$ times the number $N_S$ of fillers, the intensity of yellow light emitted from the side surface of the semiconductor light emitting device 100 decreases by 50%, and, in a case where the distributed amount of fillers 35 is $1 \times 10^8$ times the number $N_S$ of fillers, the intensity of yellow light emitted from the side surface of the semiconductor light emitting device 100 decreases by 10%.

In such a case, the fluorescent substance layer 30 can be obtained in which the surface of at least one fluorescent substance 32 is covered with the fillers 35 as shown in FIG. 3B. Here, the ratio of the size of the fluorescent substance 32 to the size of the filler 35 is different from an actual ratio. In addition, a multi-layer of the fillers 35 may be formed on the surface of the fluorescent substances 32. The at least one fluorescent substance 32 covered with the fillers 35 may have a particle diameter smaller than the average particle diameter. In addition, a fluorescent substance layer 30 may have an area in which the density of fillers decreases in a direction away from the fluorescent substances 32. For example, the density of fillers 35 formed into the multi-layer on the fluorescent substances 32 may decrease in a direction away from the fluorescent substance 32. Here, since the fluorescent substance 32 is not in a perfect sphere form, there may be a case in which the filler 35 is not formed on the whole surface of the fluorescent substance 32.

Here, the particle diameter of the fluorescent substance 32 and the particle diameter of the filler 35 are average particle diameters, and, for example, the average particle diameter of the fluorescent substances 32 can be determined based on the SEM image. In addition, the average particle diameter of the filler 35 can be determined by using a transmission electron microscopy (TEM).

Next, a method of manufacturing the semiconductor light emitting device 100 according to the embodiment will be described with reference to FIGS. 4A to 15B. FIGS. 4A to 15B show partial areas of a wafer.

FIG. 4A is a schematic cross-sectional view of a stacked body in which a first semiconductor layer 11 and a second semiconductor layer 12 are formed on a major face (the lower face in FIG. 4A) of a substrate 10. FIG. 4B is a schematic view corresponding to a lower face in FIG. 4A.

The first semiconductor layer 11 is formed on the major face of the substrate 10, and the second semiconductor layer 12 including a light emitting layer 13 is formed thereon. For example, the first semiconductor layer 11 and the second semiconductor layer 12 may contain gallium nitride, and grown on a sapphire substrate by using a metal organic chemical vapor deposition (MOCVD) method. Alternatively, a silicon substrate may be used as the substrate 10.

A first face 15a of the semiconductor layer 15 is a face through which the first semiconductor layer 11 is in contact with the substrate 10, and a second face 15b of the semiconductor layer 15 is the surface of the second semiconductor layer 12 opposite to the first semiconductor layer 11.

Figures 5A, 5B:
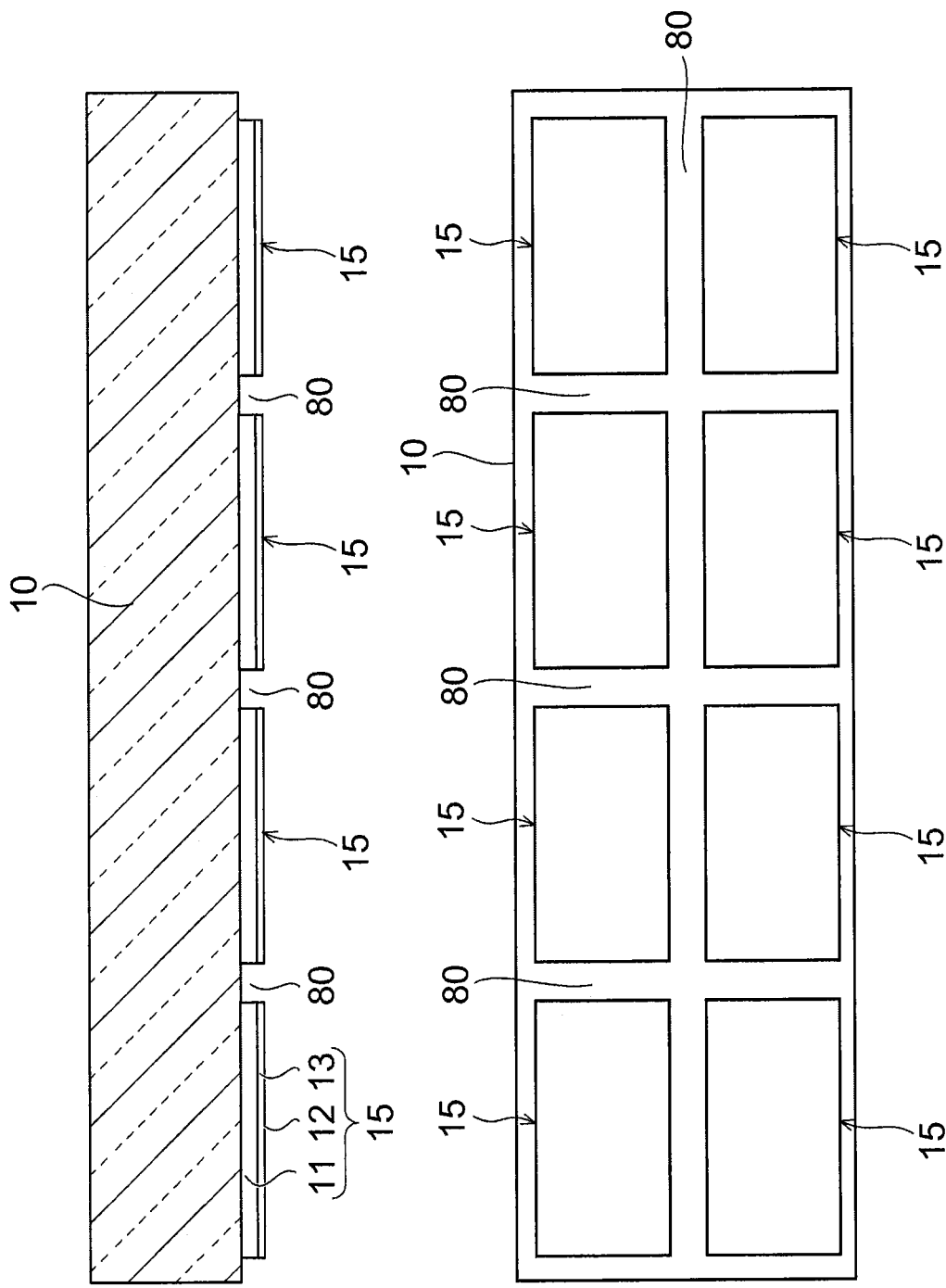

Next, as shown in FIG. 5A, a groove 80 is formed passing through the semiconductor layer 15 and reaching the substrate 10, for example, by using a reactive ion etching (RIE) method using a resist mask (not shown). As shown FIG. 5B corresponding to the lower face of FIG. 5A, the groove 80 is formed, for example, in a lattice pattern on the substrate 10, and separates the semiconductor layer 15 into a plurality of chips on the substrate 10.

Alternatively, the process for separating the semiconductor layer 15 into multiple parts may be performed after selectively removing the second semiconductor layer 12, or after forming the p-side electrode 16 and the n-side electrode.

Next, as shown in FIG. 6A and FIG. 6B corresponding to the lower face of FIG. 6A, parts of the second semiconductor layer 12 are removed so as to expose parts of the first semiconductor layer 11, for example, by using the RIE method using a resist mask (not shown). Each region in which the first semiconductor layer 11 is exposed does not include the light emitting layer 13.

Next, as shown in FIG. 7A and FIG. 7B corresponding to the lower face of FIG. 7A, p-side electrodes 16 and n-side electrodes 17 are formed on the second face of the semiconductor layer 15. The p-side electrodes 16 are formed on the surfaces of the second semiconductor layer 12. The n-side electrodes 17 are formed on the exposed surfaces of the first semiconductor layer 11.

The p-side electrodes 16 and the n-side electrodes 17, for example, are formed using a sputtering method, a vapor deposition method, or the like. Either the p-side electrodes 16 or the n-side electrodes 17 may be formed first, or the p-side electrode 16 and n-side electrodes 17 may be simultaneously formed and inevitably made of the same material.

The p-side electrode 16 has preferably formed so as to reflect the light emitted from the light emitting layer 13. Hence, the p-side electrode 16 may include silver, silver alloy, aluminum, aluminum alloy, and the like. In addition, the p-side electrode 16 may include a metal protective film (barrier metal) formed on the reflection electrode, in order to prevent the reflection electrode from the sulfurization and the oxidization.

In addition, a silicon nitride film or a silicon oxide film may be formed as a passivation film by using a chemical vapor deposition (CVD) method between the p-side electrode 16 and the n-side electrode 17 or on the end face (side surface) of the light emitting layer 13. In addition, activated annealing may be performed as necessary for forming an ohmic contact between each electrode and the semiconductor layer.

Next, after all the parts formed on the major face of the substrate 10 are covered with an insulating film 18 shown in FIG. 8A, and the insulating film 18 is patterned, for example, by using wet etching, whereby first openings 18a and a second opening 18b are selectively formed in the insulating film 18. A plurality of the first openings 18a are formed in the insulating film 18, and each of the first openings 18a reaches the p-side electrodes 16. The second opening 18b also reaches the n-side electrode 17.

For example, an organic material such as a photosensitive polyimide or benzocyclobutene can be used as the material of the insulating film 18. In such a case, the insulating film 18 can be directly exposed and developed using photo-lithography, and the first and second openings 18a, 18b are directly formed therein without using a resist mask.

Alternatively, an inorganic film such as a silicon nitride film or a silicon oxide film may be used as the insulating film 18. In a case where the insulating film 18 is an inorganic film, the first openings 18a and the second opening 18b are formed using selective etching using a resist mask formed on the insulating film 18.

Next, as shown in FIG. 8B, a metal film 19 is formed on the surface of the insulating film 18, the inner walls (the side wall and the bottom portion) of the first opening 18a, and the inner wall (the side wall and the bottom portion) of the second opening 18b. The metal film 19 is used as a seed metal for plating, which will be described later.

The metal film 19, for example, is formed using a sputtering method. The metal film 19 includes a stacked film, for example, in which a titanium (Ti) layer and a copper (Cu) layer are stacked in order from the insulating film 18 side. Alternatively, an aluminum layer may be used instead of the titanium layer.

Next, as shown in FIG. 8C, resists 91 are selectively formed on the metal film 19, and Cu electroplating is performed using the metal film 19 as a current path.

Figure 9A:
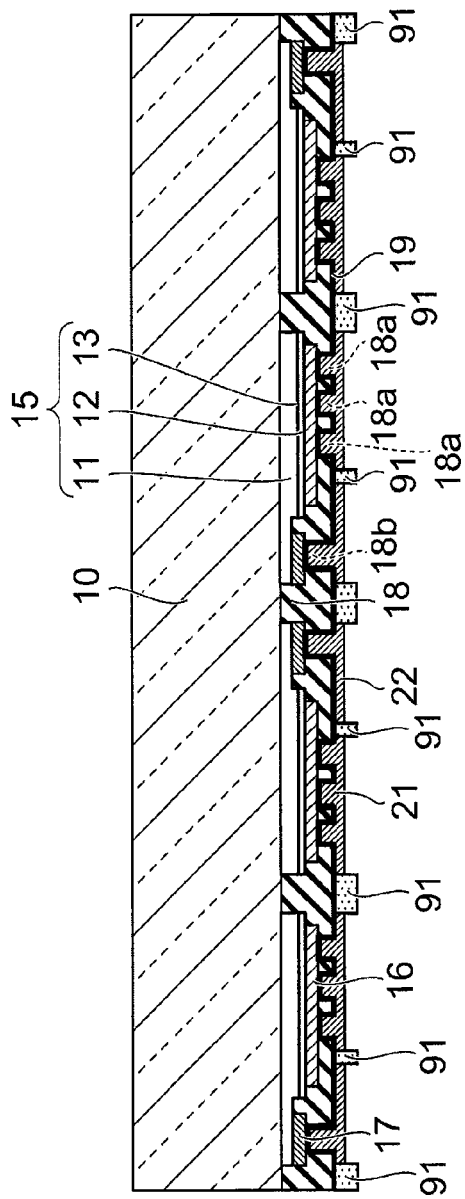
Figure 9B:
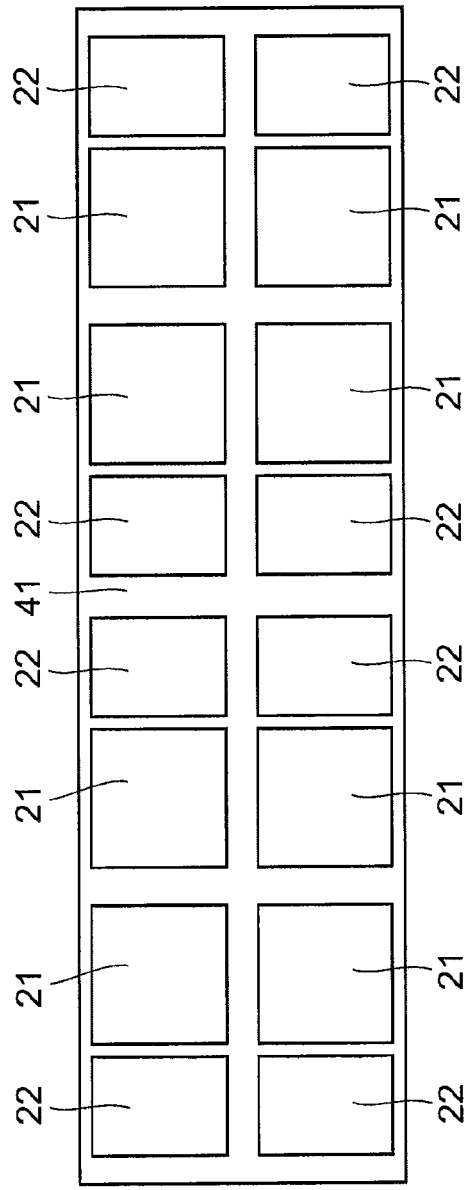

Accordingly, as shown in FIG. 9A and FIG. 9B corresponding to the lower face of FIG. 9A, a p-side interconnection layer 21 and an n-side interconnection layer 22 are selectively formed on the metal film 19. The p-side interconnection layer 21 and the n-side interconnection layer 22 are simultaneously formed, for example, by using copper plating.

The p-side interconnection layer 21 is also formed inside the first openings 18a and is electrically connected to the p-side electrode 16 via the metal film 19. In addition, the n-side interconnection layer 22 is formed also inside the second openings 18b and is electrically connected to the n-side electrodes 17 via the metal film 19.

The resists 91 that are used for plating the p-side interconnection layer 21 and the n-side interconnection layer 22 are removed using solvent or oxygen plasma.

Figures 10A, 10B:
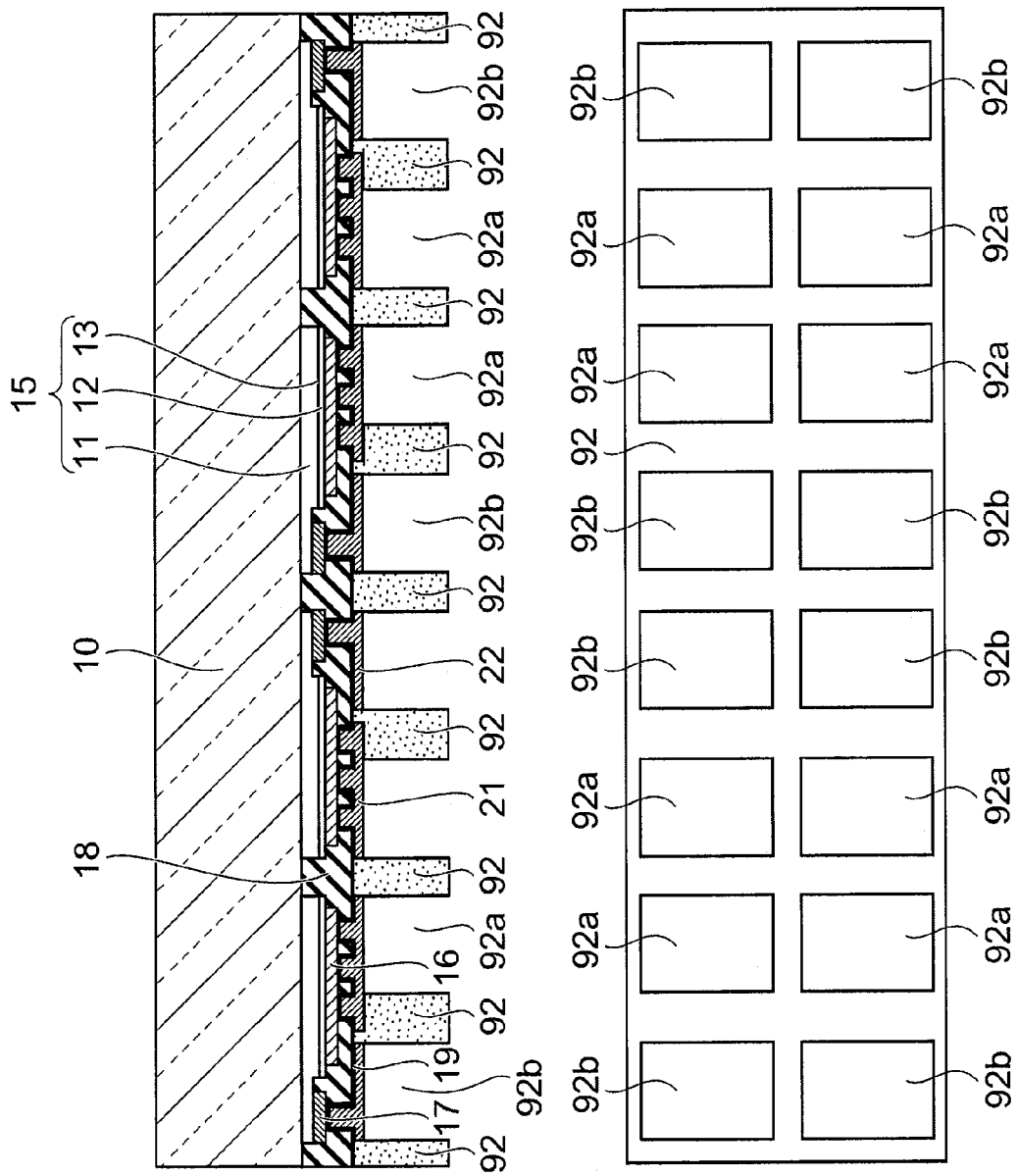

Next, as shown in FIG. 10A and FIG. 10B corresponding to the lower face of FIG. 10A, resists 92 are formed for forming metal pillars. The resist 92 is thicker than the above-described resist 91. It may be possible to leave the resists 91 without removing in the previous process, and the resists 92 are formed so as to overlap the resists 91. First openings 92a and second openings 92b are formed in the resists 92.

Figures 11A, 11B:
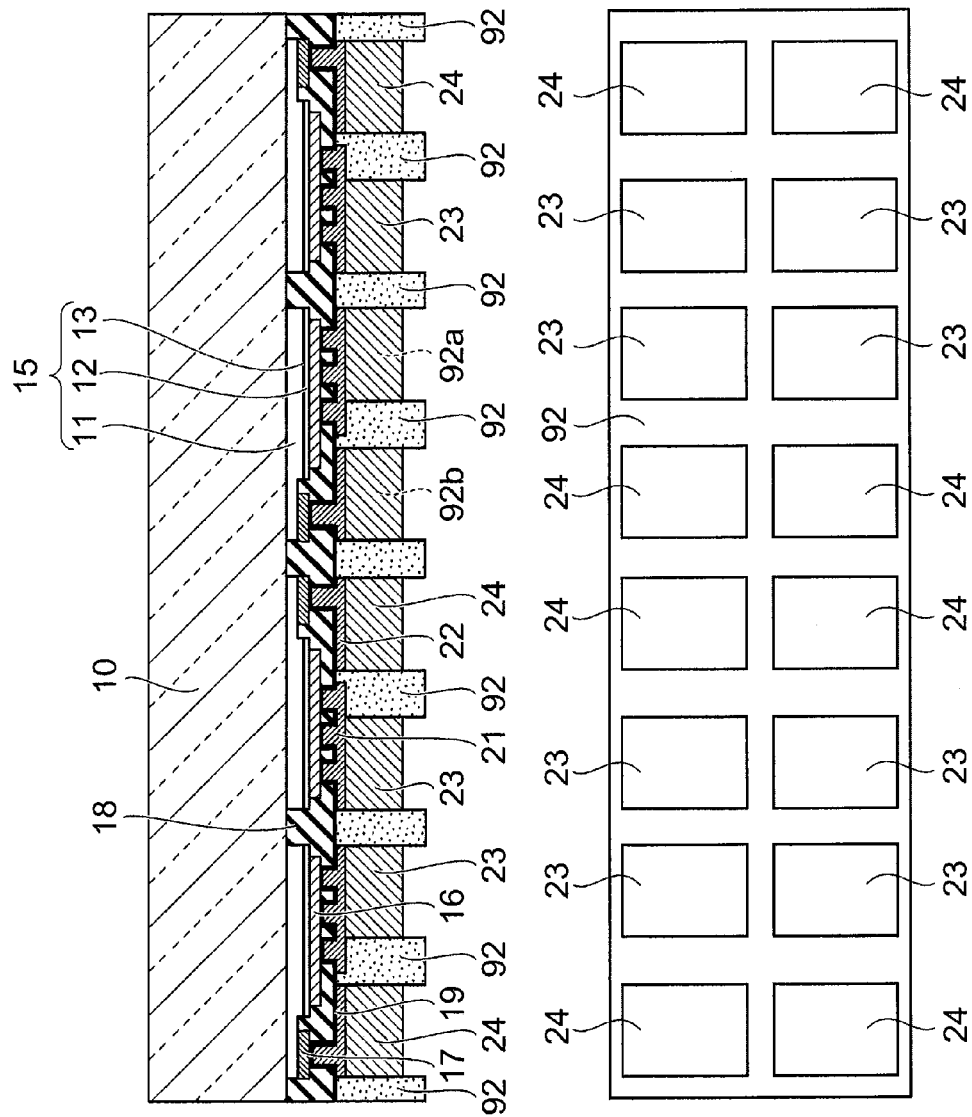

Then, Cu electroplating is performed using the metal film 19 as a current path and the resists 92 as a mask. Accordingly, as shown in FIG. 11A and FIG. 11B corresponding to the lower face of FIG. 11A, a p-side metal pillar 23 and an n-side metal pillar 24 are formed on the p-side interconnection layer 21 and n-side interconnection layer 22 respectively.

The p-side metal pillar 23 is formed on the p-side interconnection layer 21 inside the first opening 92a that is formed in the resist 92. The n-side metal pillar 24 is formed on the n-side interconnection layer 22 inside the second opening 92b that is formed in the resist 92. The p-side metal pillar 23 and the n-side metal pillar 24 are simultaneously formed using copper plating, for example.

The resist 92, as shown in FIG. 12A is removed, for example, by using solvent or oxygen plasma. Thereafter, exposed parts of the metal film 19 are removed by wet etching while using the p-side metal pillar 23, the n-side metal pillar 24, the p-side interconnection layer 21, and the n-side interconnection layer 22 as a mask. Accordingly, as shown in FIG. 12B, the p-side interconnection layer 21 and the n-side interconnection layer 22 is separated from each other on the insulating film 18, cutting off the electric connection therebetween.

Next, as shown in FIG. 13A, a resin layer 25 is stacked on the insulating film 18. The resin layer 25 covers the p-side interconnection layer 21, the n-side interconnection layer 22, the p-side metal pillar 23, and the n-side metal pillar 24.

The resin layer 25 has an insulating property. In addition, for example, carbon black may be dispersed in the resin layer 25 so as to shield the light emitted from the light emitting layer 13.

Next, the substrate 10 is removed as shown in FIG. 13B. In a case where the substrate 10 is a sapphire substrate, the substrate 10 can be removed, for example, by using a laser lift-off method. More specifically, laser light is emitted from the backside of the substrate 10 toward the first semiconductor layer 11. The laser light has transparency for the substrate 10 and has a wavelength in an absorption band of the first semiconductor layer 11.

When the laser light arrives at an interface between the substrate 10 and the first semiconductor layer 11, part of the first semiconductor layer 11 that is located near the interface absorbs energy of the laser light and decomposes. The first semiconductor layer 11 is decomposed into gallium (Ga) and nitrogen gas. According to the decomposition reaction, a minute gap is formed between the substrate 10 and the first semiconductor layer 11, whereby the substrate 10 and the first semiconductor layer 11 are separated from each other.

The laser light is radiated over the whole wafer, scanning a plurality of areas thereof and a plurality of times for each area, whereby the substrate 10 is removed from the first semiconductor layer 11.

In a case where the substrate 10 is a silicon substrate, the substrate 10 can be removed by etching from the first semiconductor layer 11.

The above-described stacked body formed on the major face of the substrate 10 is reinforced by the p-side metal pillar 23 thicker than the semiconductor layer 15, the n-side metal pillar 24, and the resin layer 25, and accordingly, the wafer shape can be maintained even after the substrate 10 is removed therefrom.

In addition, the resin layer 25 and the metal that configures the p-side metal pillar 23 and the n-side metal pillar 24 are more flexible than the material of the semiconductor layer 15. That is, the semiconductor layer 15 is supported by the flexible support members. Accordingly, when strong internal stress contained in the wafer during the epitaxial growth of the semiconductor layer 15 is released at once by removing the substrate 10, the released stress may be absorbed by the resin layer 25, the p-side metal pillar 23 and the n-side metal pillar 24, preventing the semiconductor layer 15 from being destroyed.

The first face 15a of the semiconductor layer 15 is cleaned after removing the substrate 10 therefrom. For example, gallium (Ga) that is stuck to the first face 15a is removed by using rare hydrofluoric acid or the like.

Figure 14A:
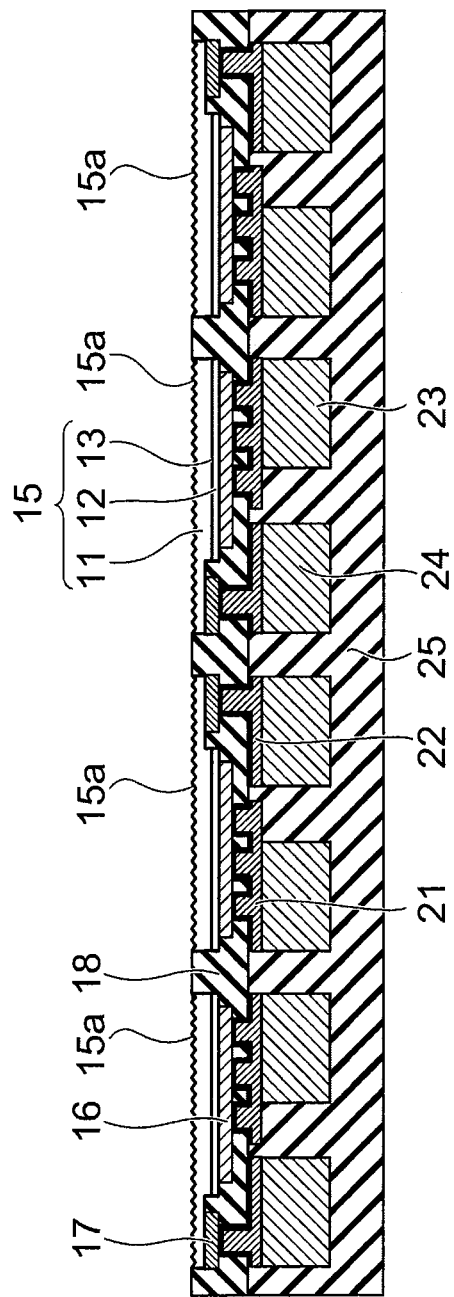

Thereafter, wet etching is performed for the first face 15a, for example, by using a potassium hydroxide (KOH) solution, tetramethylammonium hydroxide (TMAH), or the like. Accordingly, the concavo-convex is formed on the first face 15a due to a difference in the etching speed that depends on the direction of the crystal plane, as shown in FIG. 14A. Alternatively, the concavo-convex may be formed on the first face 15a by etching using a resist mask. The concavo-convex formed on the first face 15a may improve the light extraction efficiency.

Figure 14B:
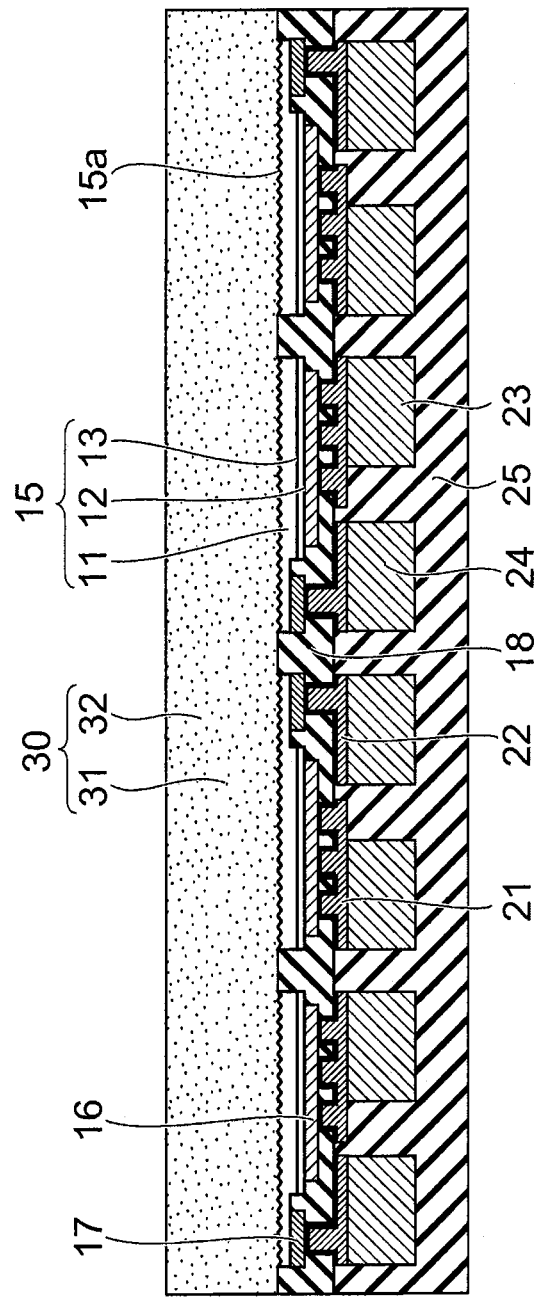

Next, as shown in FIG. 14B, a fluorescent substance layer 30 is formed on the first face 15a. The fluorescent substance layer 30 is also formed on the insulating film 18 between semiconductor layers 15 adjacent to each other.

The transparent resin 31 is thermally cured after a transparent resin 31 of a liquid phase in which fluorescent substances 32 are dispersed is supplied to the upper side of the first face 15a, for example, by using a method such as a printing method, a potting method, a molding method, or a compression molding.

For example, a silicone resin, an acrylic resin, a phenyl resin, or the like may be used as the transparent resin 31. The fluorescent substances 32 dispersed in the transparent resin 31 is, for example, one of a yellow fluorescent substance that emits yellow light, a red fluorescent substance that emits red light and a green fluorescent substance that emits green light, or the mixture of these fluorescent substances.

The average particle diameter of the fluorescent substance 32, for example, is in the range of 5 µm to 20 µm. For example, silica having a particle diameter of 10 to 50 nm is used as the filler 35. The distributed amount of the fluorescent substance 32, for example, is in the range of 30 to 50 wt %, and the distributed amount of the filler 35, for example, is in the range of 6 to 20 wt %. Accordingly, the fillers 35 corresponding to $2 \times 10^6$ to $2 \times 10^9$ times the number $N_S$ are distributed.

Next, the surface (the lower face in FIG. 14B) of the resin layer 25 is ground such that, as shown in FIG. 15A and FIG. 15B corresponding to the lower face of FIG. 15A, the p-side external terminals 23a and the n-side external terminals 24a are exposed.

Thereafter, at the position of the above-described groove 80, the transparent film 35, the wafer is diced through the fluorescent substance layer 30, the insulating film 18, and the resin layer 25 so as to separate into a plurality of semiconductor light emitting devices 100. For example, the dicing is performed using a dicing blade. Alternatively, the dicing may be performed using laser radiation.

When the dicing is performed, the substrate 10 has been already removed. In addition, since the semiconductor layer 15 is also removed in the groove 80, the semiconductor layer 15 can be prevented from damage, while the dicing is performed. In addition, the end portion (side surface) of the semiconductor layer 15 is covered with the insulating film 18. Thereby, the protection of the end portion can be obtained without any additional process after dicing into the plurality of semiconductor light emitting devices 100.

In addition, the semiconductor light emitting device 100 may have a single chip structure that includes one semiconductor layer 15 or a multiple-chip structure that includes a plurality of semiconductor layers 15.

Since each diced device includes a package protecting the semiconductor 15 and the interconnection formed therein, and the above-described manufacturing process before dicing are performed in the wafer state, it is possible to significantly reduce the production cost. In other words, the interconnection and the packaging are completed at the diced state. Accordingly, the productivity can be improved, and, as a result, the lowered price can be achieved in an easy manner.

Figure 17:
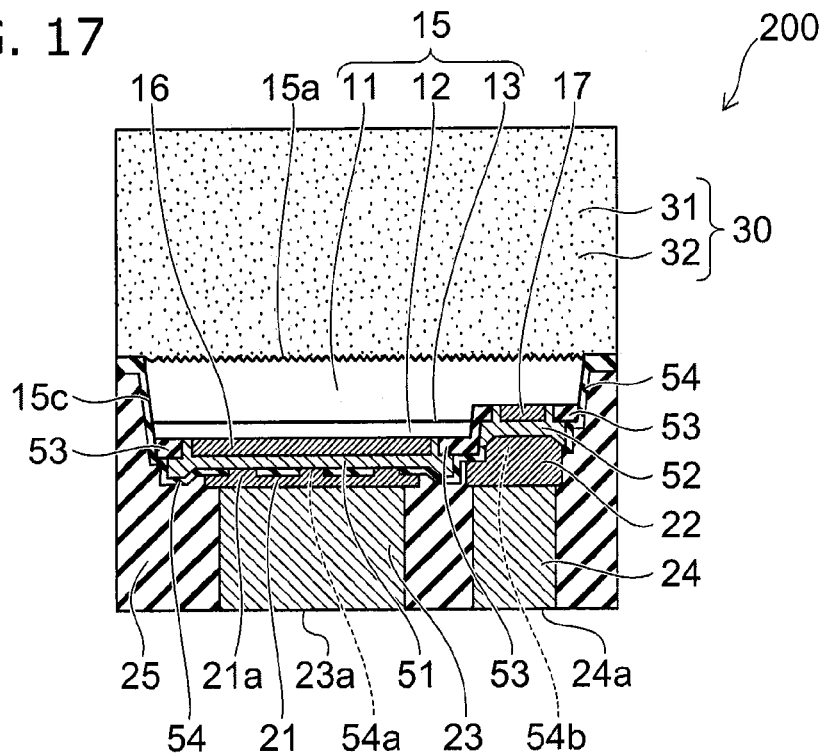
FIG. 17 is a schematic cross-sectional view of a semiconductor light emitting device according to another variation of the first embodiment.

FIG. 17 is a schematic cross-sectional view illustrating a semiconductor light emitting device 200 according to a variation of the first embodiment.

In the semiconductor light emitting device 200, a p-side pad 51 is provided on the p-side electrode 16, covering the surface and the side surface of the p-side electrode. The p-side electrode 16, for example, contains at least one of nickel (Ni), gold (Au), and rhodium (Rh), which can form an alloy together with gallium (Ga) contained in the semiconductor layer 15. The p-side pad 51 has higher reflectance than the p-side electrode 16 for the light emitted from the light emitting layer 13 and, for example, contains silver (Ag) as its main ingredient. In addition, the p-side pad 51 protects the p-side electrode 16 from oxidation or corrosion.

An n-side pad 52 is provided on the n-side electrode, covering the surface and the side surface of the n-side electrode 17. The n-side electrode 17, for example, contains at least one of nickel (Ni), gold (Au), and rhodium (Rh), which can form an alloy together with gallium (Ga) contained in the semiconductor layer 15. The n-side pad 52 has higher reflectance than the n-side electrode 17 for the light emitted from the light emitting layer 13 and, for example, contains silver (Ag) as its main ingredient. In addition, the n-side pad 52 protects the n-side electrode 17 from oxidation or corrosion.

On the second face of the semiconductor layer 15, an insulating film 53 formed, for example, from a silicone oxide film, a silicon nitride film, or the like is provided on the periphery of the p-side electrode 16 and the periphery of the n-side electrode 17. The insulating film 53 is also provided between the p-side electrode 16 and the n-side electrode 17 and between the p-side pad 51 and the n-side pad 52.

An insulating film 54 such as a silicone oxide film, a silicon nitride film, or the like is provided on the insulating film 53, the p-side pad 51, and the n-side pad 52. In addition, the insulating film 54 is provided also on the side surface 15c of the semiconductor layer 15 and covers the side surface 15c.

A p-side interconnection layer 21 and an n-side interconnection layer 22 are provided on the insulating film 54. The p-side interconnection layer 21 is connected to the p-side pad 51 through the first opening 54a formed in the insulating film 54. The n-side interconnection layer 22 is connected to the n-side pad 52 through the second opening 54b formed in the insulating film 54.

The p-side interconnection layer 21 may be connected to the p-side pad 51 through a plurality of vias 21a, as shown in FIG. 17, or may be connected to the p-side pad 51 through one post that has larger planar size than the via 21a.

The p-side metal pillar 23 that is thicker than the p-side interconnection layer 21 is provided on the p-side interconnection layer 21. The n-side metal pillar 24 that is thicker than the n-side interconnection layer 22 is provided on the n-side interconnection layer 22.

The resin layer 25 is stacked on the insulating film 54. The resin layer 25 covers the p-side interconnection that includes the p-side interconnection layer 21 and the p-side metal pillar 23, and the n-side interconnection that includes the n-side interconnection layer 22 and the n-side metal pillar 24. However, a face (a lower face in FIG. 17) of the p-side metal pillar 23, which is disposed on a side opposite to the p-side interconnection layer 21, is exposed from the resin layer 25 so as to serve as the p-side external terminal 23a. Similarly, a face (a lower face in the diagram) of the n-side metal pillar 24, which is disposed on a side opposite to the n-side interconnection layer 22, is exposed from the resin layer 25 so as to serve as the n-side external terminal 24a.

Alternatively, it may be possible to make a semiconductor light emitting device of the side view type as described later, exposing the side surface of the p-side metal pillar 23 and the side surface of the n-side metal pillar 24.

The resin layer 25 is filled via the insulating film 54 inside the above-described groove 80 that separates the semiconductor layer 15 into multiple parts on the substrate 10. Accordingly, the side surface 15c of the semiconductor layer 15 is covered with the insulating film 54 that is an inorganic film and the resin layer 25 for protection.

In addition, the fluorescent substance layer 30 is provided on the first face 15a. The fluorescent substance layer 30 includes a transparent resin 31, fluorescent substances 32 dispersed in the transparent resin 31, and fillers 35. The amount of the fillers 35 corresponding to $2\times10^6$ to $2\times10^9$ times the number $N_S$ required for covering the whole surface of the fluorescent substance 32 is dispersed. Accordingly, the optical characteristics such as light distribution characteristics and color breakup can be improved without decreasing the light output of the semiconductor light emitting device 200.

Alternatively, the p-side interconnection layer 21 and the n-side interconnection layer 22 may be directly bonded to the pads of the mounting substrate without providing the p-side metal pillar 23 and the n-side metal pillar 24.

Furthermore, the p-side interconnection layer 21 and the p-side metal pillar 23 are not limited to be the separately formed ones, and the p-side interconnection may be provided with the p-side interconnection layer 21 and the p-side metal pillar 23, which are formed into a single body in the same process. Similarly, the n-side interconnection layer 22 and the n-side metal pillar 24 are not limited to be the separately formed ones, and the n-side interconnection may be provided with the n-side interconnection layer 22 and the n-side metal pillar 24, which is formed into a single body in the same process.

Second Embodiment

Figure 18A:
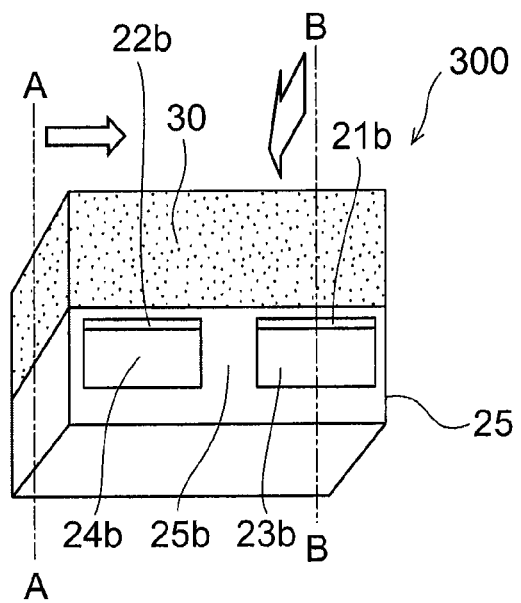
FIGS. 18A to 18C are schematic views of a semiconductor light emitting device according to a second embodiment.
Figure 18B:
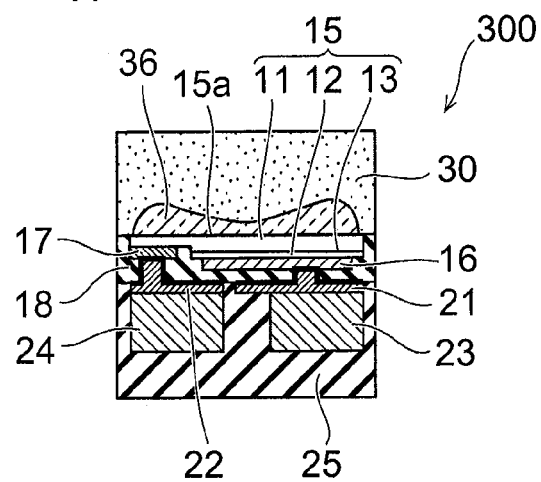
Figure 18C:
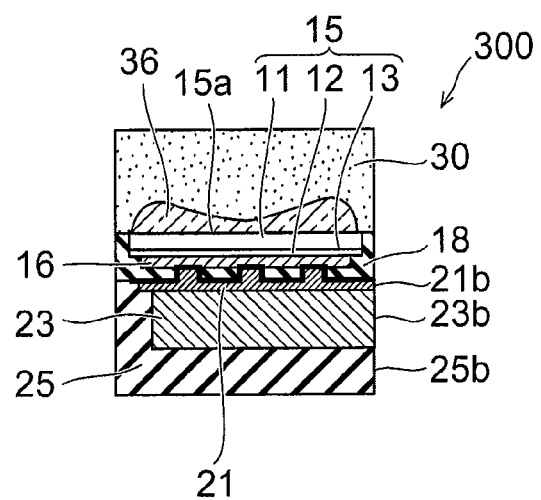

FIG. 18A is a schematic perspective view of a semiconductor light emitting device 2 according to a second embodiment. FIG. 18B is a cross-sectional view taken along line A-A shown in FIG. 18A. FIG. 18C is a cross-sectional view taken along line B-B shown in FIG. 18A.

Figure 19:
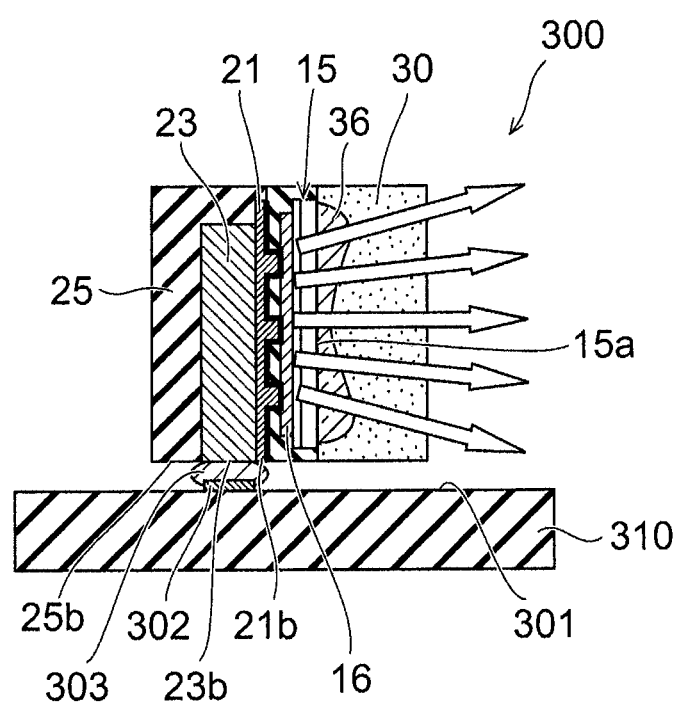
FIG. 19 is a schematic cross-sectional view of a light emitting module, in which the semiconductor light emitting device illustrated in FIGS. 18A to 18B is mounted on a mounting substrate.

FIG. 19 is a schematic cross-sectional view of a light emitting module that has a configuration in which the semiconductor light emitting device 300 is mounted on a mounting substrate 310.

As shown in FIGS. 18A and 18C, a part of the side surface of the p-side metal pillar 23 is exposed from the resin layer 25 on a third face 25b that has a plane direction different from the first face 15a and the second face of the semiconductor layer 15. The exposed face serves as a p-side external terminal 23b for mounting the semiconductor light emitting device on an external mounting substrate.

The third face 25b is a face that is approximately perpendicular to the first face 15a and the second face of the semiconductor layer 15. The resin layer 25, for example, has four side surfaces of a rectangular shape, and one of the four side surfaces is the third face 25b.

A part of the side surface of the n-side metal pillar 24 is exposed from the resin layer 25 on the third face 25b. The exposed face serves as an n-side external terminal 24b for mounting the semiconductor light emitting device on the external mounting substrate.

In addition, as shown in FIG. 18A, a part of the side surface 21b of the p-side interconnection layer 21 is also exposed from the resin layer 25 on the third face 25b and serves as a p-side external terminal. Similarly, a part of the side surface 22b of the n-side interconnection layer 22 is also exposed from the resin layer 25 on the third face 25b and serves as an n-side external terminal.

Parts of the p-side metal pillar 23 other than the p-side external terminal 23b that is exposed on the third face 25b is covered with the resin layer 25. In addition, parts of the n-side metal pillar 24 other than the n-side external terminal 24b that is exposed on the third face 25b is covered with the resin layer 25.

In addition, parts of the p-side interconnection layer 21 other than the side surface 21b that is exposed on the third face 25b is covered with the resin layer 25. In addition, parts of the n-side interconnection layer 22 other than the side surface 22b that is exposed on the third face 25b is covered with the resin layer 25.

A lens 36 is provided between the first face 15a and the fluorescent substance layer 30. The lens 36 focuses the light emitted from the light emitting layer 13 and improves the light distribution. It may be also possible not to provide the lens 36.

The semiconductor light emitting device 300, as shown in FIG. 19, is mounted in a posture in which the third face 25b faces the mounting face 301 of the mounting substrate 310. The p-side external terminal 23b and the n-side external terminal 24b that are exposed on the third face 25b are bonded to the pad 302 that is formed on the mounting face 301 through soldering 303. In addition, an interconnection pattern is formed on the mounting face 301 of the mounting substrate 310, and the pad 302 is connected to the interconnection pattern.

The third face 25b is approximately perpendicular to the first face 15a that is the major light emitting face. Accordingly, in the posture in which the third face 25b is disposed toward the lower side, i.e. facing the mounting face 301 side, the first face 15a faces in the horizontal direction, not the upper side of the mounting face 301. That is, the semiconductor light emitting device 300 is a so-called side view type device in which light is emitted in the horizontal direction in a case where the mounting face 301 is set as the horizontal plane.

Also in the semiconductor light emitting device 300 of the side view type, the optical characteristics such as light distribution and color uniformity can be improved without decreasing the light output by configuring the amount of fillers 35 to be dispersed in the fluorescent substance layer 30 to be $2\times10^6$ to $2\times10^9$ times the number $N_S$ required to cover the whole surface of the fluorescent substance 32.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A wavelength converter comprising:
   a resin allowing light emitted from a light source to pass through;
   a plurality of particle-shaped fluorescent substances dispersed in the resin, the fluorescent substances absorbing the light emitted from the light source and emitting fluorescence having a wavelength different from a wavelength of the light emitted from the light source; and
   fillers dispersed in the resin with a particle diameter smaller than the fluorescent substance, a distribution of the fillers having a density near the fluorescent substance that is higher than a density at a middle position between the fluorescent substances adjacent to each other.

2. The wavelength converter according to claim 1, wherein the density of the fillers in the resin increases closer to the fluorescent substance and decreases separating away from the fluorescent substance.

3. The wavelength converter according to claim 1, wherein the fillers are dispersed in the resin with a larger number than the number covering the whole surface of each fluorescent substance.

4. The wavelength converter according to claim 3, wherein the number of the fillers is $2\times10^6$ to $2\times10^9$ times the number covering the whole surface of each fluorescent substance.

5. The wavelength converter according to claim 1, wherein the fillers contain silica particles.

6. A semiconductor light emitting device comprising:
a semiconductor layer having a first face, a second face disposed on a side opposite to the first face, and a light emitting layer, the semiconductor layer having a first region including the light emitting layer and a second region not including the light emitting layer;
a p-side electrode provided on the first region on the second face side;
an n-side electrode provided on the second region on the second face side; and
a fluorescent substance layer provided on the first face and including a transparent resin, a plurality of fluorescent substances dispersed in the transparent resin, and fillers dispersed in the transparent resin, a density of the fillers near the fluorescent substance being higher than a density of the fillers at a middle portion between the fluorescent substances adjacent to each other.

7. The device according to claim 6, wherein the density of the fillers in the resin increases closer to the fluorescent substance and decreases separating away from the fluorescent substance.

8. The device according to claim 6, wherein the filler allows the light emitted from the light source to pass through.

9. The device according to claim 6, wherein the fillers are dispersed in the resin with a larger number than the number covering the whole surface of each fluorescent substance.

10. The device according to claim 6, wherein the number of the fillers is $2\times10^6$ to $2\times10^9$ times the number covering the whole surface of each fluorescent substance.

11. The device according to claim 6, wherein the fillers contain silica particles.

12. The device according to claim 6, wherein concavo-convex is provided on the first face, and the fluorescent substance layer covers the concavo-convex.

13. The device according to claim 12, further comprising a second insulating film provided between the p-side interconnection and the n-side interconnection.

14. The device according to claim 6, further comprising:
a first insulating film provided on a side of the second face, the first insulating film including a first opening communicating with the p-side electrode and a second opening communicating with the n-side electrode;
a p-side interconnection provided on the first insulating film and electrically connected to the p-side electrode through the first opening; and
an n-side interconnection provided on the first insulating film and electrically connected to the n-side electrode through the second opening.

15. The device according to claim 14, wherein
the p-side interconnection includes a p-side interconnection layer provided both inside the first opening and on the first insulating film, and a p-side metal pillar provided on the p-side interconnection layer, the p-side metal pillar being thicker than the p-side interconnection layer; and
the n-side interconnection includes an n-side interconnection layer provided both inside the second opening and on the first insulating film, and an n-side metal pillar provided on the n-side interconnection layer, the n-side metal pillar being thicker than the n-side interconnection layer.

16. The device according to claim 14, wherein the second insulating film covers a periphery of the p-side metal pillar and a periphery of the n-side metal pillar.

\* \* \* \* \*